(12) United States Patent
Molnar

(10) Patent No.: US 6,541,381 B2
(45) Date of Patent: *Apr. 1, 2003

(54) FINISHING METHOD FOR SEMICONDUCTOR WAFERS USING A LUBRICATING BOUNDARY LAYER

(75) Inventor: Charles J Molnar, Wilmington, DE (US)

(73) Assignee: Beaver Creek Concepts Inc, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/766,958

(22) Filed: Jan. 22, 2001

(65) Prior Publication Data

US 2001/0027018 A1 Oct. 4, 2001

Related U.S. Application Data

(63) Continuation-in-part of application No. 09/533,846, filed on Mar. 23, 2000, now Pat. No. 6,291,349, and a continuation-in-part of application No. 09/498,265, filed on Feb. 3, 2000, and a continuation-in-part of application No. 09/435,180, filed on Nov. 5, 1999, now Pat. No. 6,204,181.
(60) Provisional application No. 60/118,968, filed on Feb. 6, 1999, provisional application No. 60/111,119, filed on Dec. 7, 1998, and provisional application No. 60/107,297, filed on Nov. 6, 1998.

(51) Int. Cl.$^7$ .............................................. H01L 21/00
(52) U.S. Cl. ................ 438/690; 156/345.12; 216/38; 216/88; 216/89; 216/91; 438/691; 438/692; 438/693
(58) Field of Search ................ 438/690, 691, 438/692, 693, 745; 156/345 LP, 345.12; 216/38, 88, 89, 91; 252/79.1; 451/41, 60, 63, 287

(56) References Cited

U.S. PATENT DOCUMENTS 5,069,002 A    12/1991 Sandhu ............... 51/165 R (List continued on next page.)

FOREIGN PATENT DOCUMENTS

| WO | WO 98/08919 | 3/1998 |
| WO | WO 99/64527 | 12/1999 |
| WO | WO 00/00561 | 1/2000 |
| WO | WO 00/00567 | 1/2000 |

OTHER PUBLICATIONS 6204181 withdrawn from issue, Molnar, filed Nov. 5, 2001, published Mar. 20, 2001, Ser. No. 09/435180.
U.S. patent application Ser. No. 09/435,181, filed Nov. 5, 1999, 6,283,829.
U.S. patent application Ser. No. 09/434,723, filed Nov. 5, 1999, 6,267,644.
U.S. patent application Ser. No. 09/434,722, filed Nov. 5, 1999, 6,293,851.
U.S. patent application Ser. No. 09/434,724, filed Nov. 5, 1999, 6,204,181 with drawn from issue.
U.S. patent application Ser. No. 09/435,180, filed Nov. 5, 1999.
U.S. patent application Ser. No. 09/533,473, filed Mar. 23, 2000, 6,291,349.

(List continued on next page.)

Primary Examiner—William A. Powell

(57) ABSTRACT

A method of using lubricating boundary layers for finishing semiconductor wafers is described. The lubricating boundary layer thickness is controlled to improve finishing and reduce unwanted surface defects. Differential lubricating boundary layer methods are described to differentially finish semiconductor wafers. Planarization and localized finishing can be improved using differential lubricating boundary layer methods of finishing.

37 Claims, 5 Drawing Sheets

U.S. PATENT DOCUMENTS

| | | | |
|---|---|---|---|
| 5,107,445 A | 4/1992 | Jensen | 36/525 |
| 5,137,544 A | 8/1992 | Medillin | 51/308 |
| 5,154,512 A | 10/1992 | Schietinger | 374/9 |
| 5,166,080 A | 11/1992 | Schietinger | 437/7 |
| 5,196,353 A | 3/1993 | Sandhu | 437/7 |
| 5,308,438 A | 5/1994 | Cote | 156/636 |
| 5,314,843 A | 5/1994 | Yu | 437/225 |
| 5,340,370 A | 8/1994 | Cadien | 51/38 |
| 5,352,277 A | 10/1994 | Sasaki | 106/6 |
| 5,413,941 A | 5/1995 | Koos | 437/8 |
| 5,595,526 A | 1/1997 | Yau | 451/8 |
| 5,597,442 A | 1/1997 | Chen | 156/626.1 |
| 5,609,511 A | 3/1997 | Moriyama | 451/5 |
| 5,609,517 A | 3/1997 | Lofaro | 451/529 |
| 5,614,444 A | 3/1997 | Farkas | 437/225 |
| 5,639,388 A | 6/1997 | Kimura | 216/84 |
| 5,643,060 A | 7/1997 | Sandhu | 451/285 |
| 5,647,952 A | 7/1997 | Chen | 156/636.1 |
| 5,667,629 A | 9/1997 | Pan | 438/13 |
| 5,685,766 A | 11/1997 | Mattingly | 451/36 |
| 5,695,384 A | 12/1997 | Beratan | 451/28 |
| 5,695,660 A | 12/1997 | Litvak | 216/85 |
| 5,722,879 A | 3/1998 | Cronin | 451/281 |
| 5,728,308 A | 3/1998 | Muroyama | 216/88 |
| 5,733,176 A | 3/1998 | Robinson | 451/41 |
| 5,733,819 A | 3/1998 | Kodama | 438/692 |
| 5,735,036 A | 4/1998 | Barr | 29/603.12 |
| 5,738,562 A | 4/1998 | Doan | 451/5 |
| 5,743,784 A | 4/1998 | Birang | 451/21 |
| 5,749,769 A | 5/1998 | Church | 451/5 |
| 5,759,917 A | 6/1998 | Grover et al. | 438/690 |
| 5,762,537 A | 6/1998 | Sandhu | 451/7 |
| 5,783,489 A | 7/1998 | Kaufman | 438/692 |
| 5,830,280 A | 11/1998 | Sato | 134/2 |
| 5,833,519 A | 11/1998 | Moore | 451/56 |
| 5,842,909 A | 12/1998 | Sandhu | 451/7 |
| 5,858,813 A | 1/1999 | Scherber | 438/693 |
| 5,860,847 A | 1/1999 | Sakurai et al. | 451/10 |
| 5,876,266 A | 3/1999 | Miller | 451/56 |
| 5,876,490 A | 3/1999 | Ronay | 106/3 |
| 5,885,137 A | 3/1999 | Ploessl | 106/3 |
| 5,885,334 A | 3/1999 | Suzuki | 438/639 |
| 5,906,754 A | 5/1999 | Appel | 216/88 |
| 5,910,041 A | 6/1999 | Duescher | 451/28 |
| 5,916,855 A | 6/1999 | Avanzino | 51/307 |
| 5,919,082 A | 7/1999 | Walker | 451/41 |
| 5,934,978 A | 8/1999 | Burke | 451/36 |
| 5,945,347 A | 8/1999 | Wright | 438/692 |
| 5,954,975 A | 9/1999 | Cadien | 216/38 |
| 5,954,997 A | 9/1999 | Kaufman | 252/79.1 |
| 5,958,794 A | 9/1999 | Bruxuoort | 438/692 |
| 5,968,280 A | 10/1999 | Ronay | 134/2 |
| 5,972,793 A | 10/1999 | Tseng | 438/692 |
| 5,985,045 A | 11/1999 | Kobayashi | 148/240 |
| 5,993,298 A | 11/1999 | Duescher | 451/56 |
| 6,121,143 A | 9/2000 | Messner et al. | 438/692 |
| 6,267,644 B1 | 7/2001 | Molnar | 451/41 |
| 6,283,829 B1 | 9/2001 | Molnar | 451/8 |
| 6,291,349 B1 | 9/2001 | Molnar | 438/690 |
| 6,293,851 B1 | 9/2001 | Molnar | 451/41 |

OTHER PUBLICATIONS

U.S. patent application Ser. No. 09/533,846, filed Mar. 23, 2000.
U.S. patent application Ser. No. 09/538,409, filed Mar. 29, 2000.
U.S. patent application Ser. No. 09/766,958, filed Jan. 22, 2001.
U.S. patent application Ser. No. 09/840,423, filed Apr. 23, 2001.
U.S. patent application Ser. No. 09/916,428, filed Jul. 26, 2001.
U.S. patent application Ser. No. 09/939,957, filed Aug. 27, 2001.
U.S. patent application Ser. No. 09/954,394, filed Sep. 17, 2001.
U.S. patent application Ser. No. 09/956,687, filed Sep. 20, 2001.
Berman, Mike et al., "Review of in Situ and in Line Detection for CMP Applic.", Semiconductor Fabtech, 8$^{th}$ edition, pp. 267–274.
Bibby, Thomas, "Endpoint Detection for CMP", Journal of Electronic Materials, vol. 27, #10, 1998, pp. 1073–1081.

FINISHING METHOD FOR SEMICONDUCTOR WAFERS USING A LUBRICATING BOUNDARY LAYER

CROSS REFERENCE TO RELATED APPLICATIONS

This application claims the benefit of Provisional Application Ser. No. 60/107,297 filed on Nov. 6, 1998 entitled "Finishing method using lubricants for semiconductor wafers"; Provisional Application Ser. No. 60/111,119 filed on Dec. 7, 1998 entitled "Finishing method for semiconductor wafers using aqueous emulsion compositions"; and Provisional Application Ser. No. 60/118,968 filed on Feb. 6, 1999 entitled "Finishing method for semiconductor wafer surfaces using aqueous dispersion compositions". This application also claims benefit of and is a C.I.P. of regular patent application Ser. No. 09/435,180 filed Nov. 5, 1999 entitled "Finishing method for semiconductor wafers using a lubricating boundary layer", now U.S. Pat. No. 6,204,181, Ser. No. 09/533,846 filed Mar. 23, 2000 entitled "Abrasive finishing with partial organic boundary layer", now U.S. Pat. No. 6,291,349 and Ser. No. 09/498,265 filed Feb. 3, 2000 entitled "Finishing semiconductor wafers with a fixed abrasive finishing element". Provisional Applications and Regular Patent Applications which this application claims benefit to are included herein by reference in their entirety.

BACKGROUND ART

Chemical mechanical polishing (CMP) is generally known in the art. For example U.S. Pat. No. 5,177,908 to Tuttle issued in 1993 describes a finishing element for semiconductor wafers, having a face shaped to provide a constant, or nearly constant, surface contact rate to a workpiece such as a semiconductor wafer in order to effect improved planarity of the workpiece. U.S. Pat. No. 5,234,867 to Schultz et. al. issued in 1993 describes an apparatus for planarizing semiconductor wafers which in a preferred form includes a rotatable platen for polishing a surface of the semiconductor wafer and a motor for rotating the platen and a non-circular pad is mounted atop the platen to engage and polish the surface of the semiconductor wafer.

An objective of polishing of semiconductor layers is to make the semiconductor layers as nearly perfect as possible. Current finishing can suffer from being overly harsh on a workpiece causing unwanted scratching or other unwanted surface damage thus reducing the perfection of the surface. Further, some current finishing pad finishing surfaces can suffer from having a higher than necessary coefficient of friction when finishing a workpiece. This higher than necessary coefficient of friction can lead to other unwanted surface damage. Still further, during finishing a particle can break away from the workpiece surface forming a workpiece abrasive particle which can scratch or damage the workpiece surface. These unwanted effects are particularly important and deleterious to yield when manufacturing electronic wafers which require extremely close tolerances in required planarity and feature sizes.

It is an advantage of this invention to reduce the harshness of finishing on the workpiece surface being finished. It is an advantage of this invention to reduce unwanted scratching or other unwanted surface damage on the workpiece surface during finishing. It is further an advantage of this invention to reduce the coefficient of friction during finishing a workpiece to help reduce unwanted surface damage. It is an advantage of the invention to reduce unwanted damage to the workpiece surface when an abrasive workpiece particle breaks away workpiece surface during finishing. It is further an advantage of this invention to help improve yield for workpieces having extremely close tolerances such as semiconductor wafers.

These and other advantages of the invention will become readily apparent to those of ordinary skill in the art after reading the following disclosure of the invention.

BRIEF DESCRIPTION OF DRAWING FIGURES

REFERENCE NUMERALS IN DRAWINGS

Figure 1:
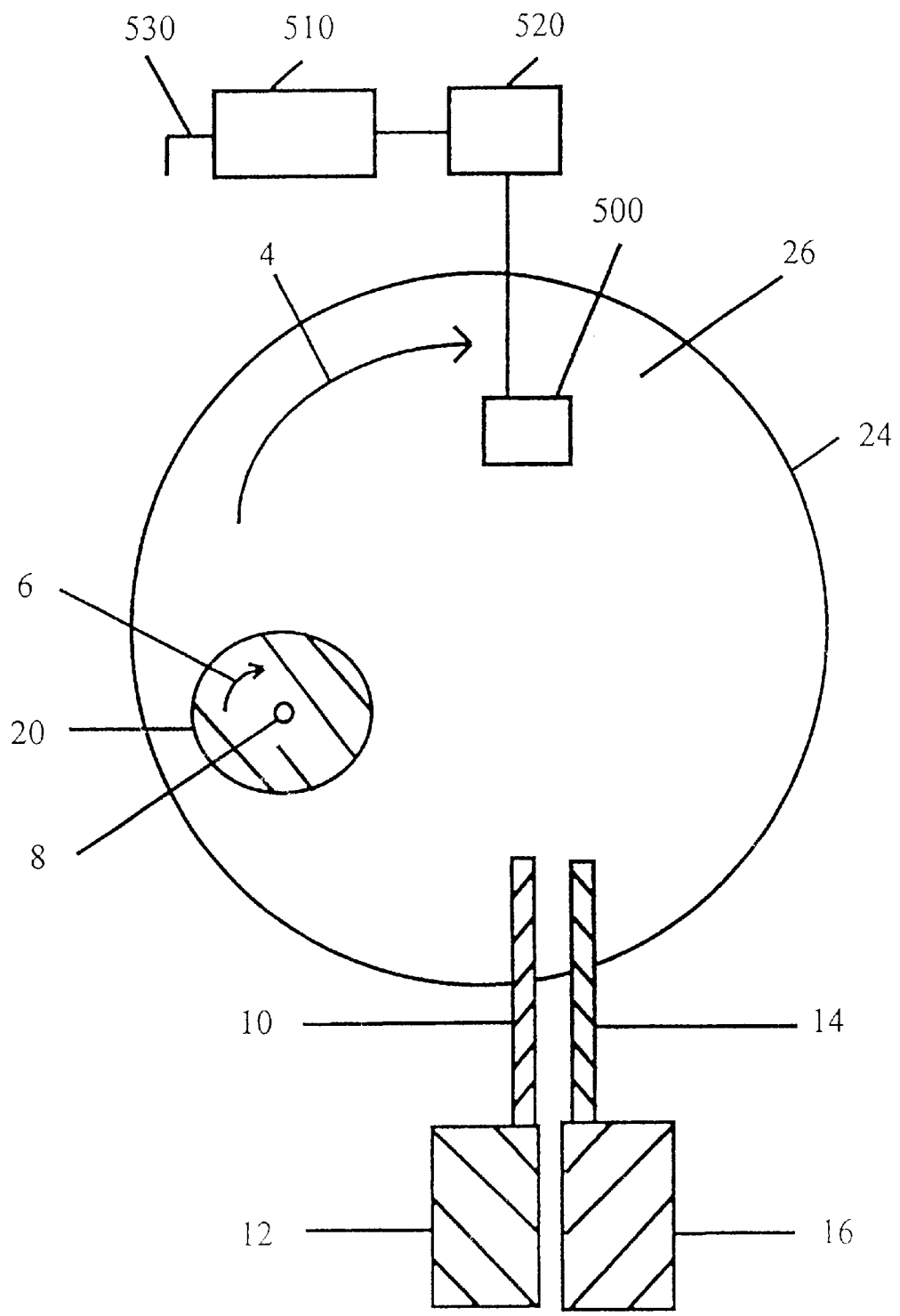
FIG. 1 is an artist's drawing of the interrelationships of the different materials when chemical mechanical finishing.

Reference Numeral 4 direction of rotation of the finishing element finishing surface Reference Numeral 6 direction of rotation of the workpiece being finished Reference Numeral 8 center of the rotation of the workpiece Reference Numeral 10 lubricant feed line for adding a lubricant composition Reference Numeral 12 a reservoir of lubricant Reference Numeral 14 finishing composition feed line for adding other chemicals Reference Numeral 16 reservoir of finishing composition Reference Numeral 17 rotating carrier for the workpiece Reference Numeral 18 operative contact element Reference Numeral 20 workpiece Reference Numeral 21 workpiece surface facing away from the workpiece surface being finished.

Reference Numeral 22 surface of the workpiece being finished

Reference Numeral 23 raised surface perturbation

Reference Numeral 24 finishing element

Reference Numeral 26 finishing element finishing surface

Reference Numeral 28 finishing element surface facing away from workpiece surface being finished Reference Numeral 30 polishing composition Reference Numeral 32 operative finishing motion Reference Numeral 33 pressure applied to the operative finishing interface substantially perpendicular to the finishing motion Reference Numeral 40 platen Reference Numeral 42 surface of the platen facing the finishing element Reference Numeral 44 surface of the platen facing away from the finishing element Reference Numeral 54 base support structure Reference Numeral 56 surface of the base support structure facing the platen Reference Numeral 60 carrier housing Reference Numeral 62 pressure distributive element Reference Numeral 500 operative sensor Reference numeral 510 processor.

Reference Numeral 520 controller.

Reference Numeral 530 operative connections for controlling

Reference Numeral 800 portion of a semiconductor wafer surface having two unwanted raised regions.

Reference Numeral 802 unwanted raised regions on the semiconductor surface being finished.

Reference Numeral 804 lower local regions on the semiconductor surface being finished proximate to the unwanted raised regions.

Reference Numeral 810 finishing surface contacting unwanted raised regions

Reference Numeral 812 finishing element surface local region displaced from but proximate to and lower than the unwanted raised local regions.

Reference Numeral 900 boundary layer lubrication.

Reference Numeral 902 thinner regions of boundary layer lubrication

Reference Numeral 904 thicker regions of boundary layer lubrication

SUMMARY OF INVENTION

A preferred embodiment of this invention is directed to a method of finishing of a semiconductor wafer surface being finished comprising a step of providing a finishing element finishing surface; a step of providing an organic lubricant to an operative finishing interface; and a step of applying an operative finishing motion in the operative finishing interface in a manner that forms an organic lubricating boundary layer of from 1 to 6 molecules thick.

A preferred embodiment of this invention is directed to a method of finishing of a semiconductor wafer surface being finished having uniform regions and a plurality of wafer die, each wafer die having a repeating pattern of unwanted raised regions, the method comprising the step a) of providing a finishing element finishing surface; the step b) of supplying an organic boundary lubricant to the interface between the semiconductor wafer surface being finished and the finishing element finishing surface; the step c) of positioning the semiconductor wafer surface being finished proximate to the finishing surface; and the step e) of applying an operative finishing motion in the interface between the semiconductor wafer surface being finished and the finishing element finishing surface, and wherein applying the operative finishing motion to the operative finishing interface forms an organic lubricating boundary layer of from 1 to 6 molecules thick which interacts with and adheres to the semiconductor wafer surface for at least a portion of the finishing cycle time.

A preferred embodiment of this invention is directed to a method of finishing of a semiconductor wafer surface being finished having uniform regions having a plurality of unwanted raised regions, the method comprising the step of a) of providing a finishing element finishing surface; the step b) of supplying an organic boundary lubricant to the interface between the semiconductor wafer surface being finished and the finishing element finishing surface; the step c) of positioning the semiconductor wafer surface being finished proximate to the finishing surface; and the step e) of applying an operative finishing motion in the interface between the semiconductor wafer surface being finished; and wherein applying the operative finishing motion to the operative finishing interface forms an organic lubricating boundary layer having a thickness of at most 4 molecules on at least a portion of the semiconductor surface being finished and the operative finishing motion forms a friction in the interface between a uniform region of the semiconductor wafer surface and the finishing element finishing surface; the organic boundary layer physically or chemically interacts with and adheres to a uniform region of the semiconductor wafer surface; and the friction formed between the uniform region of the semiconductor wafer surface and the finishing element finishing surface is determined by properties other than viscosity.

Another preferred embodiment of this invention is directed to a method of finishing of a semiconductor wafer surface being finished comprising the step of a) of providing a finishing element finishing surface; the step b) of providing an organic lubricant to an operative finishing interface; and the step e) of applying an operative finishing motion in the operative finishing interface forming an organic lubricating boundary layer of from 1 to 6 molecules thick; and the step f) of controlling at least once the thickness of the organic lubricating boundary layer which changes the coefficient of friction in the operative finishing interface by changing at least one process control parameter in situ based on feed back information from a lubrication control subsystem during the finishing cycle time.

Other preferred embodiments are discussed herein.

DETAILED DESCRIPTION OF PREFERRED EMBODIMENTS OF THE INVENTION

The book *Chemical Mechanical Planarization of Microelectric Materials* by Steigerwald, J. M. et al published by John Wiley & Sons, ISBN 0471138274 generally describes chemical mechanical finishing and is included herein by reference in its entirety for general background. In chemical mechanical finishing the workpiece is generally separated from the finishing element by a polishing slurry. The workpiece surface being finished is in parallel motion with finishing element finishing surface disposed towards the workpiece surface being finished. The abrasive particles such as that found in a polishing slurry interposed between these surfaces finish the workpiece.

Figure 2:
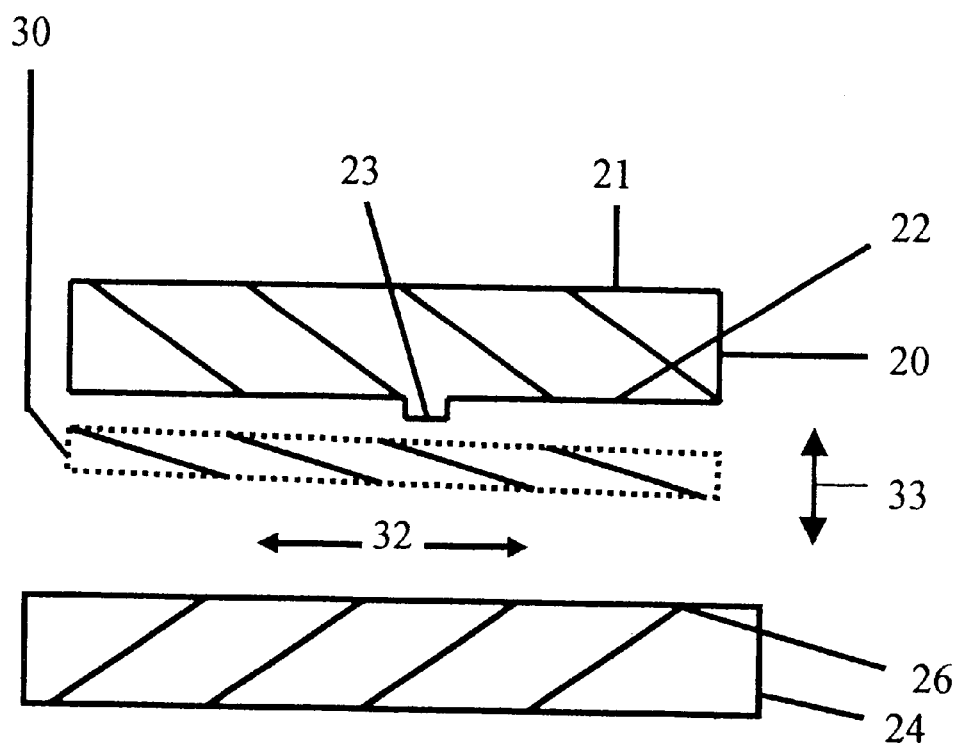
FIG. 2 is an artist's drawing of a particularly preferred embodiment of this invention including the interrelationships of the different objects when chemical mechanical finishing.
Figure 3:
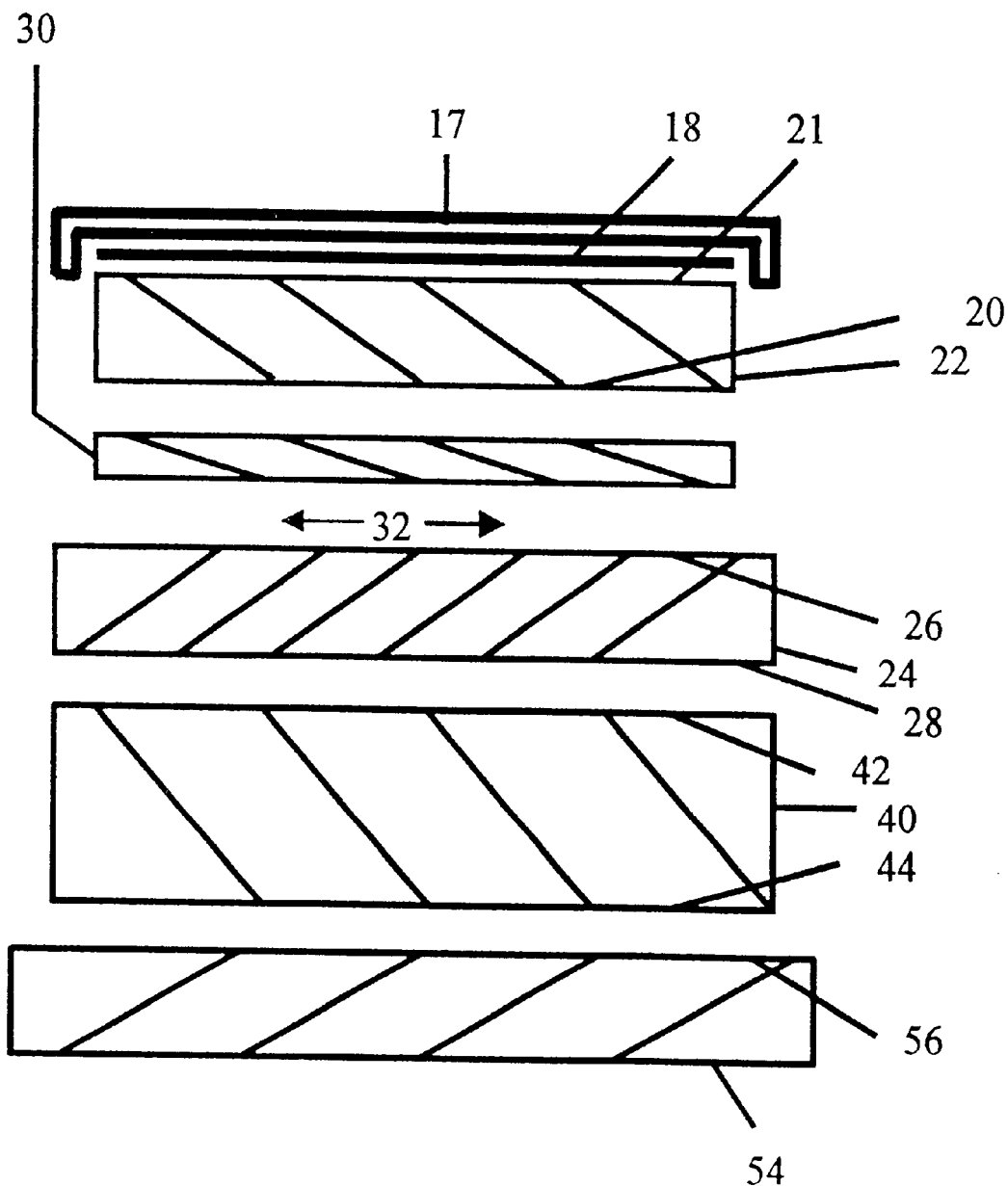
FIG. 3 is a close up drawing of a preferred embodiment of this invention

Discussion of some of the terms useful to aid in understanding this invention is now presented. Finishing is a term used herein for both planarizing and polishing. Planarizing is the process of making a surface which has raised surface perturbations or cupped lower areas (or regions) into a planar surface and thus involves reducing or eliminating the raised surface perturbations and cupped lower areas (or regions). Planarizing changes the topography of the work piece from non planar to ideally perfectly planar. Polishing is the process of smoothing or polishing the surface of an object and tends to follow the topography of the workpiece surface being polished. A finishing element is a term used herein to describe a pad or element for both polishing and planarizing. A finishing element finishing surface is a term used herein for a finishing element surface used for both polishing and planarizing. A finishing element planarizing surface is a term used herein for a finishing element surface used for planarizing. A finishing element polishing surface is a term used herein for a finishing element surface used for polishing. Workpiece surface being finished is a term used herein for a workpiece surface undergoing either or both polishing and planarizing. A workpiece surface being planarized is a workpiece surface undergoing planarizing. A workpiece surface being polished is a workpiece surface undergoing polishing. The finishing cycle time is the elapsed time in minutes that the workpiece is being finished. A portion of a finishing cycle time is about 5% to 95% of the total finishing cycle time in minutes and a more preferred portion of a finishing cycle time is 10% to 90% of the total finishing cycle time in minutes. The planarizing cycle time is the elapsed time in minutes that the workpiece is being planarized. The polishing cycle time is the elapsed time in minutes that the workpiece is being polishing. FIGS. 1–3 are now discussed to better illustrate the invention.

As used herein, an emulsion is a fluid containing a microscopically heterogeneous mixture of two (2) normally immiscible liquid phases, in which one liquid forms minute droplets suspended in the other liquid. As used herein, a surfactant is a surface active substance, i. e., alters (usually reduces) the surface tension of water. Non limiting examples of surfactants include ionic, nonionic, and cationic. As used herein, a lubricant is an agent that reduces friction between moving surfaces. A hydrocarbon oil is a non limiting example. As used herein, soluble means capable of mixing with a liquid (dissolving) to form a homogeneous mixture (solution).

As used herein, a dispersion is a fluid containing a microscopically heterogeneous mixture of solid phase material dispersed in a liquid and in which the solid phase material is in minute particles suspended in the liquid. As used herein, a surfactant is a surface active substance, i. e., alters (usually reduces) the surface tension of water. Non limiting examples of surfactants include ionic, nonionic, and cationic. As used herein, a lubricant is an agent that reduces friction between moving surfaces. As used herein, soluble means capable of mixing with a liquid (dissolving) to form a homogeneous mixture (solution).

As used herein, a die is one unit on a semiconductor wafer generally separated by scribe lines. After the semiconductor wafer fabrication steps are completed, the die are separated into units generally by sawing. The separated units are generally referred to as "chips". Each semiconductor wafer generally has many die which are generally rectangular. The terminology semiconductor wafer and die are generally known to those skilled in the arts. As used herein, within die uniformity refers to the uniformity of within the die. As used herein, local planarity refers to die planarity unless specifically defined otherwise. Within wafer uniformity refers to the uniformity of finishing of the wafer. As used herein, wafer planarity refers to planarity across a wafer. Multiple die planarity is the planarity across a defined number of die. As used herein, global wafer planarity refers to planarity across the entire semiconductor wafer planarity. Planarity is important for the photolithography step generally common to semiconductor wafer processing, particularly where feature sizes are less than 0.25 microns. As used herein, a device is a discrete circuit such as a transistor, resistor, or capacitor. As used herein, pattern density is ratio of the raised (up) area in square millimeters to the to area in square millimeters of region on a specific region such as a die or semiconductor wafer. As used herein, pattern density is ratio of the raised (up) area in square millimeters to the total area in square millimeters of region on a specific region such as a die or semiconductor wafer. As used herein, line pattern density is the ratio of the line width to the pitch. As used herein, pitch is line width plus the oxide space. As an illustrative example, pitch is the copper line width plus the oxide spacing. Oxide pattern density, as used herein, is the volume fraction of the oxide within an infinitesimally thin surface of the die. FIGS. 1–3 are now discussed to better illustrate the invention.

FIG. 1 is an artist's drawing of a particularly preferred embodiment of this invention when looking from a top down perspective including the interrelationships of some important objects when finishing according to the method of this invention. Reference Numeral 24 represents the finishing element. Reference Numeral 26 represents the finishing element finishing surface. Reference Numeral 4 represents the direction of rotation of the finishing element finishing surface. Reference Numeral 20 represents the workpiece being finished. The workpiece surface facing the finishing element finishing surface is the workpiece surface being finished. Reference Numeral 6 represents the direction of rotation of the workpiece being finished. Reference Numeral 8 is the center of the rotation of the workpiece. Reference Numeral 10 represents a lubricant feed line for adding a lubricant composition to the workpiece surface to improve the quality of finishing. The lubricant feed line can have a plurality of exit orifices. A lubricant feed line which supplies the lubricant adjacent or near the point of use is preferred. Reference Numeral 12 represents a reservoir of lubricant to be fed to workpiece surface. A fluid borne lubricant is preferred and a water borne lubricant is more preferred. A fluid borne lubricant which is free of abrasives is particularly preferred. Supplying a finishing composition without abrasives is preferred and supplying a finishing composition without abrasive particles is more preferred for some applications such as where a fixed abrasive finishing element finishing surface is used for finishing. Supplying a lubricant which is free of an encapsulating film or encapsulating thin resin structure is preferred. Encapsulating lubricants is an expensive and complex step which is unnecessary in this invention. Further, encapsulated lubricants tend to burst on breaking and can higher than desired localized lubricants to regions. The encapsulated lubricants can prematurely burst releasing their contents during manufacture of the slurry and/or finishing element. This can contaminate the slurry and/or finishing element and adversely affect their respective finishing performance. Supplying a finishing composition without abrasives is preferred and supplying a finishing composition without abrasive particles is more preferred. Feeding a water borne finishing composition having a lubricant which is free of abrasive particles is also preferred and feeding a water borne finishing composition having a lubricant which is free of abrasive particles is particularly preferred. A lubricant free of separated from the abrasive particles is preferred. A lubricant free of separated from and unconnected to the abrasive particles is preferred. Not shown is the feed mechanism for the lubricant such as variable air or gas pressure or pump mechanism. Reference Numeral 14 represents a finishing composition feed line for adding other chemicals to the surface of the workpiece such as abrasive particles, acids, bases, buffers, other chemical reagents, and the like. A finishing composition having abrasive particles is preferred. Reference Numeral 16 represents a reservoir of finishing composition to be fed to workpiece surface. Not shown is the feed mechanism for the finishing composition such a variable air or gas pressure or pump mechanism. Another preferred embodiment, not shown, is to have a wiping element, preferably an elastomeric wiping element, to uniformly distribute the lubricant across the finishing element finishing surface. Nonlimiting examples of some preferred slurry dispensing systems and slurry wiping elements is found in U.S. Pat. No. 5,709,593 to Guthrie et. al., U.S. Pat. No. 5,246,525 to Junichi, and U.S. Pat. No. 5,478,435 to Murphy et. al. and are included herein by reference in their entirety for general guidance and appropriate modifications by those generally skilled in the art for supplying lubricants and preferably water borne lubricants. As shown in FIG. 1, a separate feed line for the lubricant composition and the finishing composition is particularly preferred. The separate feed line for the lubricant composition delivers the lubricant proximate to the point of use. The separate feed line for the finishing composition delivers the finishing composition proximate to the point of use. Alternately supplying the finishing composition through pores or holes in the finishing element finishing surface to effect a uniform distribution of the lubricant is also effective. Reference Numeral 500 represents a operative sensor. An energy change sensor is a preferred operative sensor. Reference numeral 510 represents a processor. Reference Numeral 520 represents a controller. Reference Numeral 530 represents the operative connections for controlling. Operative connections are generally known to those skilled in the art. Illustrative preferred examples include controlling the operative finishing motion. Further examples are discussed herein below. FIGS. 2 and 3 will now provide an artists' expanded view of some relationships between the workpiece and the finishing element.

FIG. 2 is an artist's close up drawing of the interrelationships of some of the important aspects when finishing according to a preferred embodiment of this invention. Reference Numeral 20 represents the workpiece. Reference Numeral 21 represents the workpiece surface facing away from the workpiece surface being finished. Reference Numeral 22 represents the surface of the workpiece being finished. Reference Numeral 23 represents a high region (unwanted raised region) on the workpiece surface being finished. During finishing, the high region is preferably substantially removed and more preferably, the high region (unwanted raised region) is removed and surface polished. Reference Numeral 24 represents the finishing element. Reference Numeral 26 represents the surface of the finishing element facing the workpiece and is often referred to herein as the finishing element finishing surface. Reference Numeral 30 represents a lubricant and optionally, a finishing composition disposed between the workpiece surface being finished and finishing element finishing surface. A finishing composition comprising a water based composition is preferred. The workpiece surface being finished is in operative finishing motion relative to the finishing element finishing surface. The workpiece surface being finished in operative finishing motion relative to the finishing element finishing surface is an example of a preferred operative finishing motion. The operative finishing interface, as used herein, means the interface between the finishing element finishing surface and the workpiece surface being finished. Reference Numeral 32 represents a preferred operative finishing motion between the surface of the workpiece being finished and finishing element finishing surface. Reference Numeral 33 represents a pressure applied to the operative interface perpendicular to operative finishing motion.

FIG. 3 is an artist's close up drawing of a preferred embodiment of this invention showing some further interrelationships of the different objects when finishing according to the method of this invention. Reference Numeral 17 represents a carrier for the workpiece and in this particular embodiment, the carrier is a rotating carrier. The rotating carrier is operable to rotate the workpiece against the finishing element which rests against the platen and optionally has a motor. Optionally, the rotating carrier can also be designed to move the workpiece laterally, in an arch, figure eight, or orbitally to enhance uniformity of polishing. The workpiece is in operative contact with the rotating carrier and optionally, has an operative contact element (Reference Numeral 18) to effect the operative contact. An illustrative example of an operative contact element is a workpiece held in place to the rotating carrier with a bonding agent (Reference Numeral 18). A hot wax is an illustrative example of a preferred bonding agent. Alternately, a porometric film can be placed in the rotating carrier having a recess for holding the workpiece. A wetted porometric film (Reference Numeral 18) will hold the workpiece in place by surface tension. An adherent thin film is another preferred example of placing the workpiece in operative contact with the rotating carrier. Reference Numeral 20 represents the workpiece. Reference Numeral 21 represents the workpiece surface facing away from the workpiece surface being finished. Reference Numeral 22 represents the surface of the workpiece being finished. Reference Numeral 24 represents the finishing element. Reference Numeral 26 represents the finishing element finishing surface. Reference Numeral 28 represents the surface of the finishing element facing away from the workpiece surface being finished. Reference Numeral 30 represents the lubricant and optionally, the finishing composition supplied between the workpiece surface being finished and surface of the finishing element facing the workpiece. Reference Numeral 32 represents a preferred direction of the operative finishing motion between the surface of the workpiece being finished and the finishing element finishing surface. Reference Numeral 40 represents the platen or support for the finishing element. The platen can also have an operative finishing motion relative to the workpiece surface being finished. Reference Numeral 42 represents the surface of the platen facing the finishing element. The surface of the platen facing the finishing element is in support contact with the finishing element surface facing away from the workpiece surface being finished. The finishing element surface facing the platen can, optionally, be connected to the platen by adhesion. Frictional forces between the finishing element and the platen can also retain the finishing element against the platen. Reference Numeral 44 is the surface of the platen facing away from the finishing element. Reference Numeral 54 represents the base support structure. Reference Numeral 56 represents the surface of the base support structure facing the platen. The rotatable carrier (Reference Number 16) can be operatively connected to the base structure to permit improved control of pressure application at the workpiece surface being finished (Reference Numeral 22).

Applicant currently believes that the higher than desirable defects in the workpiece surface being finished is due to the fact that the abrasive particles in the slurry can tend to scratch or gouge the surface, particularly when recycling slurries to conserve costs. Further, since the abrasive particles of the slurry can become dull and worn prematurely which can also negatively impact the recycle of slurry abrasive particles to conserve resources and costs. Still further, some finishing element finishing surface tends to have a higher coefficient of friction than necessary with the workpiece being finished which can lead to destructive surface forces on the workpiece surface being finished such as chatter. Each of the above situations can lead to less than desirable surface quality on the workpiece surface being finished and earlier than necessary wear on the finishing element finishing surface and on the abrasive particles themselves. Applicant currently believes that proper choice and supply of a lubricant to the interface of the workpiece surface being finished and the finishing element finishing surface can reduce or eliminate the tendency to scratch and/or damage workpiece surface being finished. Applicant currently believes that proper choice and supply of a lubricant to the interface of the workpiece surface being finished and the finishing element finishing surface can reduce or eliminate the negative effects of high coefficient of friction such as chatter. Applicant currently believes that proper choice and supply of a lubricant to the interface of the workpiece surface being finished and the finishing element finishing surface can extend the useful life of the finishing element finishing surface by reducing erosive forces. The lubricant reduces the wear to the abrasive particles due to attrition wear and tribochemical wear. Thus the lubricant can help to maintain the "cutting ability" of the slurry abrasive particles. Supplying the lubricant at the point of use and free of abrasive slurry particles can reduce or prevent negative interactions between the abrasive slurry and the lubricant such as causing instability in the abrasive slurry and is preferred. Supplying the lubricant proximate to workpiece surface being finished is preferred. By supplying the lubricant separate from the slurry or finishing composition interactions which can destabilize the slurry and/or the fluid lubricant feed are minimized or totally avoided. This increases both lubricant and finishing composition flexibility. Supplying an organic boundary lubricant to the operative finishing interface (located between finishing element finishing surface and the workpiece surface being finished) can further reduce the of chatter, micro localized distortions in the finishing element finishing surface, and also increases the uniformity of finishing across the surface of the workpiece surface being finished. Forming the lubricating boundary layer differentially can improve local planarity and enhance finishing flexibility as discussed herein. Lubrication reduces abrasive wear to the abrasive particles and to the finishing element finishing surface by reducing friction forces. Differential boundary lubrication can enhance localized finishing rates to improve the semiconductor wafer surface. Lubrication reduces the friction which reduces adverse forces particularly on a high speed belt finishing element which under high friction can cause belt chatter, localized belt stretching, and/or belt distortions, high tendency to scratch and/or damage workpiece surface being finished. Localized and or micro localized distortions to the surface of a finishing element and chatter can also occur with other finishing motions and/elements and lubrication can reduce or eliminate these.

Supply of lubricant to the interface of the workpiece surface being finished and the finishing element finishing surface to extend the finishing element finishing surface useful life is preferred. Supply of lubricant to the interface of the workpiece surface being finished and the finishing element finishing surface to reduce unwanted surface defects in the workpiece surface being finished is preferred. Supply of lubricant at the point of use is preferred and supply of lubricant with uniform distribution on the finishing element finishing surface prior to the operative finishing interface is currently more preferred. Supply of lubricant to the interface of the workpiece surface being finished and the finishing element finishing surface to reduce unwanted breaking away of the workpiece surface being finished is preferred. Supply of a thin lubricating boundary layer is particularly preferred. An effective amount of boundary lubricant often can help meeting a plurality of these advantages simultaneously.

The new problem recognition and unique solution are new and considered part of this current invention.

Finishing Element

A finishing element for finishing high precision workpieces is known. As used herein a finishing element is a integral finishing element having a surface or surfaces which rub against the workpiece surface being finished in an operative finishing motion.

A finishing element comprising at least one material selected from the group consisting of an organic synthetic resin, an inorganic polymer, and combinations thereof is preferred. A preferred example of organic synthetic resin is an thermoplastic resin. Another preferred example of an organic synthetic resin is a thermoset resin. Preferred examples of organic synthetic resins consist of materials selected from the group consisting of polyurethanes, polyolefins, polyesters, polyamides, polystyrenes, polycarbonates, polyvinyl chlorides, polyimides, epoxies, chloroprene rubbers, ethylene propylene elastomers, butyl resins, polybutadienes, polyisoprenes, EPDM elastomers, and styrene butadiene elastomers. Preferred stiff finishing surfaces can comprise polyphenylene sulfide, polysulfone, and polyphenylene oxide polymers. Phenolic polymers can also be used. Copolymer resins are also preferred. Polyolefin resins are particularly preferred for their generally low cost. Polyurethanes are preferred for the inherent flexibility in formulations. A finishing element comprising a foamed organic synthetic resins are particularly preferred. Finishing elements comprising compressible and porous material is preferred. Commercial finishing elements are available from Rodel in Wilmington, Del. A finishing element finishing surface, preferably abrasive finishing element finishing surface, free of fluorocarbon matter can be preferred for some types of finishing because the fluorocarbon matter can be difficult to clean from some workpiece surfaces after finishing, particularly with aqueous cleaning compositions.

Some illustrative nonlimiting examples of preferred finishing elements for use in the invention are also discussed. A finishing element having at least a layer of an elastomeric material having a Shore A hardness of at least 30 A is preferred. ASTM D 676 is used to measure hardness. A porous finishing element is preferred to more effectively transfer the polishing slurry to the surface of the workpiece being finished. A finishing element comprising a synthetic resin material is preferred. A finishing element comprising a thermoset resin material is more preferred. A finishing element having layers of different compositions is preferred to improve the operative finishing motion on the workpiece surface being finished. As an example, a finishing element having two layers, one a hard layer and one a soft layer, can better transfer the energy of operative finishing motion to the workpiece surface being finished than a similar thickness finishing element of only a very soft layer. A thermoset synthetic resin is less prone to elastic flow and thus is more stable in this application. A finishing element which is thin is preferred because it generally transfers the operative finishing motion to the workpiece surface being finished more efficiently. A finishing element having a thickness from 0.5 to 0.002 cm is preferred and a thickness from 0.3 to 0.005 cm is more preferred and a finishing element having a thickness from 0.2 to 0.01 cm is even more preferred. Current synthetic resin materials can be made quite thin now. The minimum thickness will be determined by the finishing element's integrity and longevity during polishing which will depend on such parameters as tensile and tear strength. A finishing element having sufficient strength and tear strength for chemical mechanical finishing is preferred.

A finishing element having a flex modulus in particular ranges is also preferred. An abrasive finishing element having a high flex modulus is generally more efficient for planarizing. A finishing element having a low flex modulus is generally more efficient for polishing. Further a continuous belt fixed finishing element can have a different optimum flex modulus than a disk. One also needs to consider the workpiece surface to be finished in selecting the flex modulus. A finishing element comprising a synthetic resin having flex modulus of at most 1,000,000 psi is preferred and having flex modulus of at most 800,000 psi is more preferred and 500,000 psi is more preferred. Flex modulus is preferably measured with ASTM 790 B at 73 degrees Fahrenheit. Finishing elements comprising a synthetic resin having a very low flex modulus are also generally known to those skilled in the art such as elastomeric polyurethanes which can also be used. A finishing element having a flex modulus of greater than 1,000,000 psi can be preferred for some particular planarizing applications.

For some embodiments, polishing pad designs and equipment such as in U.S. Pat. No. 5,702,290 to Leach, a polishing pad having a high flexural modulus can be effective and preferred. A finishing element having a continuous phase of material imparting resistance to local flexing is preferred. A preferred continuous phase of material is a synthetic polymer, more preferably an organic synthetic polymer. An organic synthetic polymer having a flexural modulus of at least 50,000 psi is preferred and having a flexural modulus of at least 100,000 psi is more preferred and having a flexural modulus of at least 200,000 psi is even more preferred for the continuous phase of synthetic polymer in the finishing element. An organic synthetic polymer having a flexural modulus of at most 5,000,000 psi is preferred and having a flexural modulus of at most 3,000,000 psi is more preferred and having a flexural modulus of at most 2,000,000 psi is even more preferred for the continuous phase of synthetic polymer in the finishing element. An organic synthetic polymer having a flexural modulus of from 5,000,000 to 50,000 psi is preferred and having a flexural modulus of from 3,000,000 to 100,000 psi is more preferred and having a flexural modulus of at from 2,000,000 to 200,000 psi is even more preferred for the continuous phase of synthetic polymer in the finishing element. For some less demanding applications (such as die with a lower pattern density), a flexural modulus of at least 20,000 psi is preferred. These ranges of flexural modulus for the synthetic polymers provide useful performance for finishing a semiconductor wafer and can improve local planarity in the semiconductor. Flexural modulus is preferably measured with ASTM 790 B at 73 degrees Fahrenheit. Pounds per square inch is psi.

An finishing element having Young's modulus in particular ranges is also preferred. An finishing element having a high Young's modulus is generally more efficient for planarizing. An finishing element having a low Young's modulus is generally more efficient for polishing. Further a continuous belt finishing element can have a different optimum Young's modulus than a finishing element finishing disk. One also needs to consider the workpiece surface to be finished in selecting the Young's modulus. For a flexible finishing element having a Young's modulus from 100 to 700,000 psi (pounds per square in inch) is preferred and having a Young's modulus from 300 to 200,000 psi (pounds per square in inch) is more preferred and having a Young's modulus from 300 to 150,000 psi (pounds per square in inch) is even more preferred. Particularly stiff finishing elements can have a preferred Young's modulus of at least 700,000 psi. For particularly flexible finishing elements, a Young's modulus of less than 100,000 psi are preferred and less than 50,000 psi is more preferred.

Figure 4A:
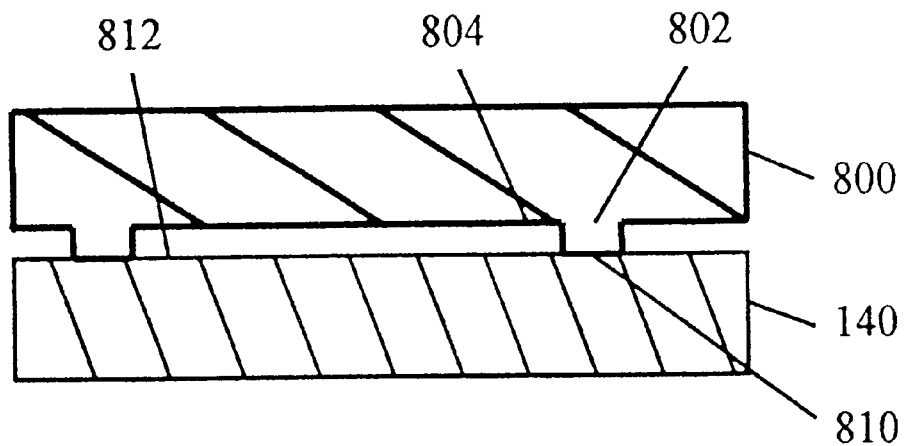
FIG. 4 is an artist's representation of finishing some unwanted raised regions and some regions below the unwanted raised regions with differential boundary lubrication.
Figure 4B:
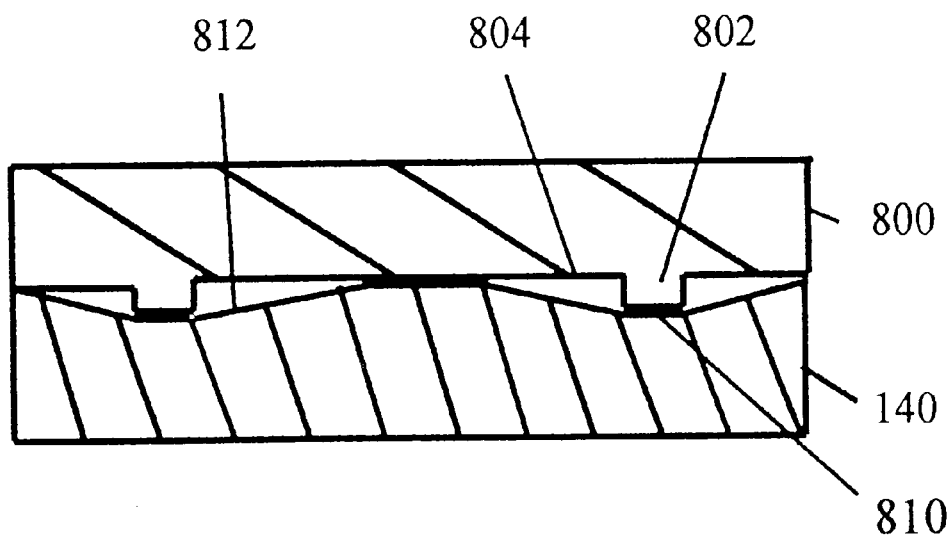

FIG. 4 is an artist's representation of finishing some unwanted raised regions and some regions below the unwanted raised regions. Reference Numeral 800 represents a portion of a semiconductor wafer surface having two unwanted raised regions. Reference Numeral 802 represent unwanted raised regions on the semiconductor surface being finished. Reference Numeral 804 represent lower local regions on the semiconductor surface being finished proximate to the unwanted raised regions. Reference Numeral 810 represents the finishing element finishing surface in local contact with the unwanted raised regions (Reference Numeral 802). Reference Numeral 812 represents the finishing element surface local region displaced from but proximate to and lower than the unwanted raised local regions. Reference Numeral 140 represents the finishing element having a finishing element surface. As shown the finishing element finishing surface can reduce pressure and/or lose actual contact with the lower local regions on the semiconductor proximate to the unwanted raised local regions. This leads to unwanted raised regions having higher pressure which in turn can reduce the lubricating boundary layer thickness in the unwanted raised regions. Reducing the lubricating boundary layer thickness generally increases local tangential friction forces, raises the finishing rate measured in angstroms per minute on the unwanted raised regions. Also the pressure in lower regions proximate the unwanted raised regions have lower pressure applied which in turn can increase boundary layer thickness in these lower regions. Increasing the lubricating boundary layer thickness generally decreases local tangential forces lowering the finishing rate measured in angstroms per minute in these lower regions proximate the unwanted raised regions. By increasing finishing rate in the unwanted raised regions and lowering the finishing rate in the proximate lower regions the planarity of the semiconductor is generally improved. This generally helps the unwanted raised regions to have higher finishing rates when measured in angstroms per minute and improves within die nonuniformity. As shown in the FIG. 4, the region of contact with the unwanted raised region is small which in turn raises the finishing pressure applied by the finishing elements having a higher flexural modulus and this increased pressure increases the finishing rate measured in angstroms per minute at the unwanted raised region. This higher pressure on the unwanted raised region also increases frictional heat which can further increase finishing rate measured in angstroms per minute in the unwanted raised region. Boundary lubrication on the unwanted raised region can be reduced due to the higher temperature and/or pressure which further increases friction and finishing rate measured in angstroms per minute. Higher stiffness finishing element finishing surfaces apply higher pressures to the unwanted raised local regions which can further improve planarization, finishing rates, and within die nonuniformity. Finishing using finishing elements of this in invention wherein the unwanted raised regions have a finishing rate measured in angstroms per minute of at least 1.6 times faster than in the proximate low local region measured in angstroms per minute is preferred and wherein the unwanted raised regions have a finishing rate of at least 2 times faster than in the proximate low local region is more preferred and wherein the unwanted raised regions have a finishing rate of at least 4 times faster than in the proximate low local region is even more preferred and wherein the unwanted raised regions have a finishing rate of at least 8 times faster than in the proximate low local region is even more particularly preferred. Where there is no contact with the proximate low local region, the finishing rate in the low local region can be very small and thus the ratio between the finishing rate in the unwanted raised region to finishing rate in the low local region can be large. Using boundary lubrication control methods of this in invention wherein the unwanted raised regions have a finishing rate measured in angstroms per minute of from 1.6 to 500 times faster than in the proximate low local region measured in angstroms per minute is preferred and wherein the unwanted raised regions have a finishing rate of from 2 to 300 times faster than in the proximate low local region is more preferred and wherein the unwanted raised regions have a finishing rate of from 2 to 200 times faster than in the proximate low local region is even more preferred and wherein the unwanted raised regions have a finishing rate of from 4 to 200 times faster than in the proximate low local region is even more preferred and wherein the unwanted raised regions have a finishing rate of from 8 to 200 times faster than in the proximate low local region is even more particularly preferred. By increasing the stiffness of the finishing element finishing surface, the pressure applied to the unwanted raised region can be increased. Flexural modulus as measured by ASTM 790 B at 73 degrees Fahrenheit is a useful guide to help raise the stiffness of a polymer finishing element. By adjusting the flexural modulus as measured by ASTM 790 B at 73 degrees Fahrenheit the pressure can be increased on the unwanted raised regions to increase finishing rates measured in Angstroms per minute. Applying at least two times higher pressure to the unwanted raised region when compared to the applied pressure in a lower region proximate unwanted raised region is preferred and applying at least three times higher pressure to the unwanted raised region when compared to the applied pressure in a lower region proximate unwanted raised region is more preferred and applying five times higher pressure to the unwanted raised region when compared to the applied pressure in a lower region proximate unwanted raised region is even more preferred. Applying 2 to 100 times higher pressure to the unwanted raised region when compared to the applied pressure in a lower region proximate unwanted raised region is preferred and applying at least 3 to 100 times higher pressure to the unwanted raised region when compared to the applied pressure in a lower region proximate unwanted raised region is more preferred and applying 5 to 50 times higher pressure to the unwanted raised region when compared to the applied pressure in a lower region proximate unwanted raised region is even more preferred. Because the lower region proximate the unwanted raised region can have a very low pressure, at most 100 times higher pressure in the unwanted raised regions compared to the pressure in a lower region proximate the unwanted raised region is preferred and at most 50 times higher pressure in the unwanted raised regions compared to the pressure in a lower region proximate the unwanted raised region is more preferred. Applying an operative finishing motion wherein the unwanted raised regions have a temperature of at least 3 degrees centigrade higher than in the proximate low local region is preferred and finishing wherein the unwanted raised regions have a temperature of at least 7 degrees centigrade higher than in the proximate low local region is more preferred and finishing wherein the unwanted raised regions have a temperature of at least 10 degrees centigrade higher than in the proximate low local region is even preferred. Finishing wherein the unwanted raised regions have a temperature from 3 to 50 degrees centigrade higher than in the proximate low local region is preferred and finishing wherein the unwanted raised regions have a temperature from 7 to 45 degrees centigrade higher than in the proximate low local region is more preferred and finishing wherein the unwanted raised regions have a temperature of from 10 to 40 degrees centigrade higher than in the proximate low local region is even more preferred. By adjusting the flexural modulus of the finishing element finishing surface, lubricating boundary layer, and the other control parameters discussed herein, finishing and planarization of semiconductor wafer surfaces can be accomplished. The lubricating boundary layer will now be illustrated in FIG. 5.

Figure 5:
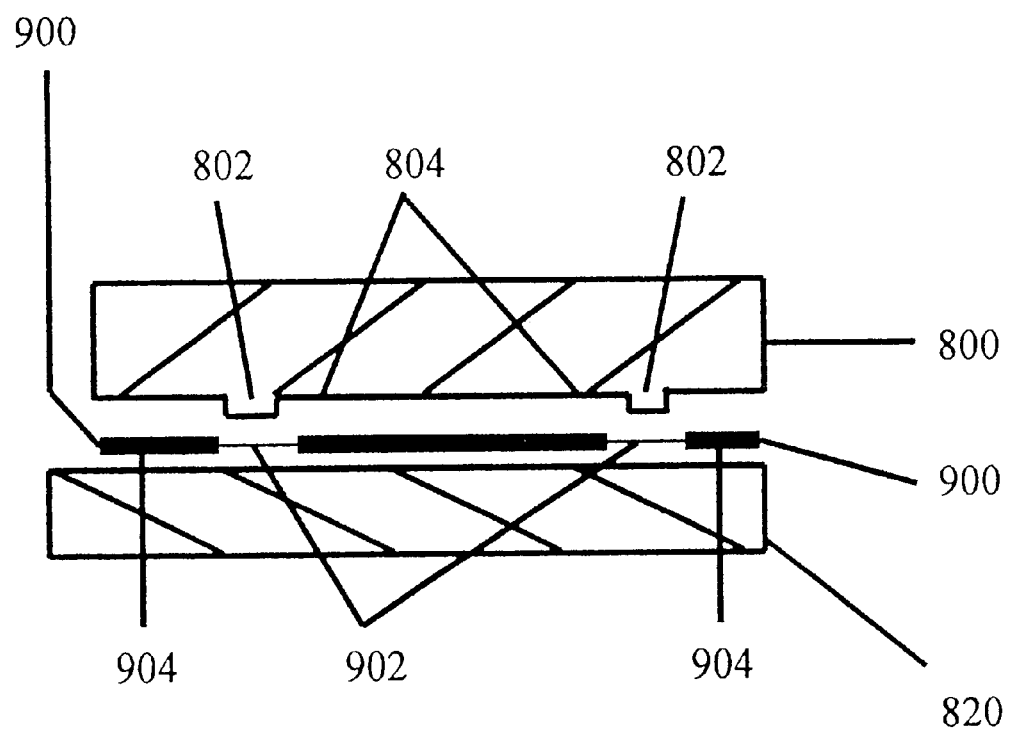
FIG. 5 is an artist's representation of an example of the effects on the boundary layer lubrication.

FIG. 5 is an artist's representation of an example of the effects on the boundary layer lubrication discussed herein above. As discussed herein, it is not drawn to scale so the boundary layer thickness can be illustrated in simple fashion for helpful guidance. Reference Numeral 800 represents a cross-sectional view of a semiconductor wafer having two unwanted raised regions (Reference Numeral 802). Reference Numeral 804 represents a cross-sectional view of a semiconductor wafer having lower regions proximate to the two unwanted raised regions (Reference Numeral 802). Reference Numeral 900 represents the lubricating boundary layer. Reference Numeral 902 represents two thinner regions of lubricating boundary layer (for instance having a thickness of 4 molecules). Note that the thinner regions of a lubricating boundary layer can occur proximate the unwanted raised regions on the semiconductor wafer surface being finished. Reference Numeral 904 represents a thicker region of lubricating boundary layer which can generally occur in regions proximate to and below the unwanted raised regions. Reference Numeral 820 represents a small cross-section of finishing element. The different local regions having different lubricating boundary layers and lubricating properties. Differential lubricating boundary layers can improve planarization for some semiconductor wafers (particularly at the die level).

Optional Finishing Element Abrasive Surface

Fixed abrasive finishing elements having abrasive particles can be preferred for some types of finishing, particularly where disposal of spent slurry is an environmental issue. Inorganic abrasive particles comprise preferred abrasive particles. Organic synthetic particles comprise preferred abrasive particles. A fixed abrasive finishing element having abrasive asperities on the finishing surface is a preferred fixed abrasive finishing element. Abrasive particles can be dispersed in the finishing element to make a low cost abrasive finishing element. Abrasive asperities can be molded into a finishing element surface with low cost and at high speed making them preferred for some applications.

A finishing element having fixed abrasives for finishing high precision workpieces is known. As used herein a fixed abrasive finishing element is a integral abrasive finishing element. The integral abrasive finishing element having abrasives particles connected to at least the surface of the finishing element is preferred. The integral abrasive finishing element having abrasives particles connected to at least the surface of the finishing element and which is substantially free of unconnected abrasive particles except for those formed during the actual finishing process itself is more preferred. A three dimensional fixed abrasive finishing element as used herein is a fixed abrasive finishing element having multiple abrasive particles dispersed throughout at least as portion of its thickness such that if some of the surface is removed additional abrasive particles are exposed on the newly exposed surface. A fixed abrasive finishing element which applies a substantially uniform distribution of abrasive particles over the workpiece surface being finished is preferred.

A fixed abrasive finishing element comprising at least one material selected from the group consisting of an organic synthetic resin, an inorganic polymer, and combinations there of is preferred. A preferred example of organic synthetic resin is an thermoplastic resin. Another preferred example of an organic synthetic resin is a thermoset resin. Preferred examples of organic synthetic resins consist of materials selected from the group consisting of polyurethanes, polyolefins, polyesters, polyamides, polystyrenes, polycarbonates, polyvinyl chlorides, polyimides, epoxies, chloroprene rubbers, ethylene propylene elastomers, butyl resins, polybutadienes, polyisoprenes, EPDM elastomers, and styrene butadiene elastomers. Preferred stiff finishing surfaces can comprise polyphenylene sulfide, polysulfone, and polyphenylene oxide polymers. Phenolic polymers can also be used. Copolymer resins are also preferred. Polyolefin resins are particularly preferred for their generally low cost. Polyurethanes are preferred for the inherent flexibility in formulations. A finishing element comprising a foamed organic synthetic resins are particularly preferred. Finishing elements comprising compressible and porous material is preferred. An organic synthetic polymeric mixture having plurality different polymers is preferred. A finishing element, preferably abrasive finishing element, free of fluorocarbon compositions can be preferred for some types of finishing because the fluorocarbon compositions can be difficult to clean from some workpiece surfaces after finishing, particularly with aqueous cleaning compositions.

A fixed abrasive finishing element comprised of a synthetic resin composition is preferred. A fixed abrasive finishing element comprising at least one layer of a soft synthetic resin is preferred. A fixed abrasive finishing element comprising at least one layer of a elastomeric synthetic resin is preferred. A fixed abrasive finishing element comprising at least one layer of a thermoset elastomeric synthetic resin is preferred.

The fixed abrasive firmly attached to the finishing element finishing surface is preferred. The abrasive can be firmly attached to the finishing element finishing surface with known adhesives and/or mixed into a surface layer of a polymeric layer, preferably an organic polymeric layer. Particular abrasive surface topographies can be preferred for specific applications. Fixed abrasive finishing elements are generally known to those skilled in the art. Some nonlimiting examples include U.S. Pat. No. 4,966,245 to Callinan, U.S. Pat. No. 5,692,950 to Rutherford, U.S. Pat. No. 5,823,855 to Robinson, WO 98/06541 to Rutherford and WO 98/181159 to Hudson are included herein for general guidance and modification of fixed abrasive finishing elements by those skilled in the art.

An abrasive finishing element having abrasive asperities on the finishing element finishing surface is preferred. An abrasive finishing element having abrasive asperities having a height from 0.5 to 0.005 micrometers is preferred and an abrasive finishing element having abrasive asperities having a height from 0.3 to 0.005 micrometers is more preferred and an abrasive finishing element having abrasive asperities having a height from 0.1 to 0.01 micrometers is even more preferred and an abrasive finishing element having abrasive asperities having a height from 0.05 to 0.005 micrometers is more particularly preferred. the asperities are preferably firmly attached to the finishing element finishing surface and asperities which are an integral part of the finishing element finishing surface are more preferred. An abrasive finishing element having small asperities can finish a workpiece surface to fine tolerances.

Some illustrative nonlimiting examples of preferred finishing elements for use in the invention are also discussed. A finishing element having at least a layer of an elastomeric material having a Shore A hardness of at least 30 A is preferred. ASTM D 676 is used to measure hardness. A porous finishing element is preferred to more effectively transfer the polishing slurry to the surface of the workpiece being finished. A finishing element comprising a synthetic resin material is preferred. A finishing element comprising a thermoset resin material is more preferred. A finishing element having layers of different compositions is preferred to improve the operative finishing motion on the workpiece surface being finished. As an example, a finishing element having two layers, one a hard layer and one a soft layer, can better transfer the energy of operative finishing motion to the workpiece surface being finished than a similar thickness finishing element of only a very soft layer. A thermoset synthetic resin is less prone to elastic flow and thus is more stable in this application. A finishing element which is thin is preferred because it generally transfers the operative finishing motion to the workpiece surface being finished more efficiently. A finishing element having a thickness from 0.5 to 0.002 cm is preferred and a thickness from 0.3 to 0.005 cm is more preferred and a finishing element having a thickness from 0.2 to 0.01 cm is even more preferred. Current synthetic resin materials can be made quite thin now. The minimum thickness will be determined by the finishing element's integrity and longevity during polishing which will depend on such parameters as tensile and tear strength. A finishing element having sufficient strength and tear strength for chemical mechanical finishing is preferred.

An abrasive finishing element having a flex modulus in particular ranges is also preferred. An abrasive finishing element having a high flex modulus is generally more efficient for planarizing. An abrasive finishing element having a low flex modulus is generally more efficient for polishing. Further a continuous belt fixed abrasive finishing element can have a different optimum flex modulus than a fixed abrasive finishing element disk. One also needs to consider the workpiece surface to be finished in selecting the flex modulus. A fixed abrasive finishing element comprising a synthetic resin having flex modulus of at most 1,000,000 psi is preferred and having flex modulus of at most 800,000 psi is more preferred and 500,000 psi is more preferred. Flex modulus is preferably measured with ASTM 790 B at 73 degrees Fahrenheit. Fixed abrasive finishing elements comprising a synthetic resin having a very low flex modulus are also generally known to those skilled in the art such as elastomeric polyurethanes which can also be used. A finishing element having a flex modulus of greater than 1,000,000 psi can be preferred for some particular planarizing applications.

For some embodiments, polishing pad designs and equipment such as in U.S. Pat. No. 5,702,290 to Leach, a polishing pad having a high flexural modulus can be effective and preferred. A finishing element having a continuous phase of material imparting resistance to local flexing is preferred. A preferred continuous phase of material is a synthetic polymer, more preferably an organic synthetic polymer. An organic synthetic polymer having a flexural modulus of at least 50,000 psi is preferred and having a flexural modulus of at least 100,000 psi is more preferred and having a flexural modulus of at least 200,000 psi is even more preferred for the continuous phase of synthetic polymer in the finishing element. An organic synthetic polymer having a flexural modulus of at most 5,000,000 psi is preferred and having a flexural modulus of at most 3,000,000 psi is more preferred and having a flexural modulus of at most 2,000,000 psi is even more preferred for the continuous phase of synthetic polymer in the finishing element.

An organic synthetic polymer having a flexural modulus of from 5,000,000 to 50,000 psi is preferred and having a flexural modulus of from 3,000,000 to 100,000 psi is more preferred and having a flexural modulus of at from 2,000,000 to 200,000 psi is even more preferred for the continuous phase of synthetic polymer in the finishing element. For some less demanding applications (such as die with a lower pattern density), a flexural modulus of at least 20,000 psi is preferred. These ranges of flexural modulus for the synthetic polymers provide useful performance for finishing a semiconductor wafer and can improve local planarity in the semiconductor. Flexural modulus is preferably measured with ASTM 790 B at 73 degrees Fahrenheit. Pounds per square inch is psi.

An abrasive finishing element having Young's modulus in particular ranges is also preferred. An abrasive finishing element having a high Young's modulus is generally more efficient for planarizing. An abrasive finishing element having a low Young's modulus is generally more efficient for polishing. Further a continuous belt fixed abrasive finishing element can have a different optimum Young's modulus than a fixed abrasive finishing element disk. One also needs to consider the workpiece surface to be finished in selecting the Young's modulus. For a flexible abrasive finishing element having a Young's modulus from 100 to 700,000 psi (pounds per square in inch) is preferred and having a Young's modulus from 300 to 200,000 psi (pounds per square in inch) is more preferred and having a Young's modulus from 300 to 150,000 psi (pounds per square in inch) is even more preferred. Particularly stiff abrasive finishing elements can have a preferred Young's modulus of at least 700,000 psi. For particularly flexible abrasive finishing elements, a Young's modulus of less than 100,000 psi are preferred and less than 50,000 psi is more preferred.

Illustrative preferred abrasive particles comprising silica, silicon nitride, alumina, and ceria are preferred. Fumed silica is particularly preferred. A metal oxide is a type of preferred abrasive particle. A particularly preferred particulate abrasive is an abrasive selected from the group consisting of iron (III) oxide, iron (II) oxide, magnesium oxide, barium carbonate, calcium carbonate, manganese dioxide, silicon dioxide, cerium dioxide, cerium oxide, chromium (III) trioxide, and aluminum trioxide. Abrasive particles having an average diameter of less than 0.5 micrometers is preferred and less than 0.3 micrometer is more preferred and less than 0.1 micrometer is even more preferred and less than 0.05 micrometers is even more particularly preferred. Abrasive particles having an average diameter of from 0.5 to 0.01 micrometer is preferred and between 0.3 to 0.01 micrometer is more preferred and between 0.1 to 0.01 micrometer is even more preferred.

Abrasive particles having a different composition from the finishing element body are preferred. An abrasive particle having a Knoops hardness of less than diamond is particularly preferred to reduce microscratches on workpiece surface being finished and a Knoops hardness of less than 50 GPa is more particularly preferred and a Knoops hardness of less than 40 GPa is even more particularly preferred and a Knoops hardness of less than 35 GPa is especially particularly preferred. An abrasive particle having a Knoops hardness of at least 1.5 GPa is preferred and having a Knoops hardness of at least 2 is preferred. An abrasive particle having a Knoops hardness of from 1.5 to 50 GPa is preferred and having a Knoops hardness of from 2 to 40 GPa is preferred and having a Knoops hardness of from 2 to 30 GPa is even more preferred. A fixed abrasive finishing element having a plurality of abrasive particles having at least two different Knoops hardnesses can be preferred.

Workpiece

A workpiece needing finishing is preferred. A homogeneous surface composition is a workpiece surface having one composition throughout and is preferred for some applications. A workpiece needing polishing is preferred. A workpiece needing planarizing is especially preferred. A workpiece having a microelectronic surface is preferred. A workpiece surface having a heterogeneous surface composition is preferred. A heterogeneous surface composition has different regions (and/or different areas) with different compositions on the surface. A workpiece having a microelectronic surface having both conductive regions and nonconductive regions is more preferred and is an example of a preferred heterogeneous workpiece surface. Illustrative examples of conductive regions can be regions having copper or tungsten and other known conductors, especially metallic conductors. Metallic conductive regions in the workpiece surface including metals selected from the group consisting of copper, aluminum, and tungsten or combinations thereof are particularly preferred. A semiconductor wafer surface having a repeating pattern of reflective surfaces can be a preferred workpiece surface. A wafer die having a repeating pattern of reflective surfaces can be a preferred workpiece surface. A semiconductor device is a preferred workpiece. A substrate wafer is a preferred workpiece. A semiconductor wafer having a polymeric layer requiring finishing is preferred because a lubricant can be particularly helpful in reducing unwanted surface damage to the softer polymeric surfaces. An example of a preferred polymer is a polyimide. Polyimide polymers are commercially available from E. I. DuPont Co. in Wilmington, Del.

This invention is particularly preferred for workpieces requiring a highly flat surface. Finishing a workpiece surface to a surface to meet the specified semiconductor industry circuit design rule is preferred and finishing a workpiece surface to a surface to meet the 0.35 micrometers feature size semiconductor design rule is more preferred and finishing a workpiece surface to a surface to meet the 0.25 micrometers feature size semiconductor design rule is even more preferred and finishing a workpiece surface to a to meet the 0.18 micrometers semiconductor design rule is even more particularly preferred. An electronic wafer finished to meet a required surface flatness of the wafer device rule in to be used in the manufacture of ULSIs (Ultra Large Scale Integrated Circuits) is a particularly preferred workpiece made with a method according to preferred embodiments of this invention. The design rules for semiconductors are generally known to those skilled in the art. Guidance can also be found in the "The National Technology Roadmap for Semiconductors" published by SEMATECH in Austin, Tex.

For finishing of semiconductor wafers having low-k dielectric layers, finishing aids, more preferably lubricating aids, are preferred. Illustrative nonlimiting examples of low-k dielectrics are low-k polymeric materials, low-k porous materials, and low-k foam materials. As used herein, a low-k dielectric has at most a k range of less than 3.5 and more preferably less than 3.0. Illustrative examples include doped oxides, organic polymers, highly fluorinated organic polymers, and porous materials. Low-k dielectric materials are generally known to those skilled in the semiconductor wafer arts. Abrasive organic synthetic resin particles can be effective to finishing low-dielectric materials. Abrasive organic synthetic resin asperities can be effective to finishing low-dielectric materials.

Finishing Composition

Finishing compositions are generally known for finishing workpieces. A chemical mechanical polishing slurry used for chemical mechanical polishing (CMP) is a preferred example of a finishing composition. A chemical mechanical polishing slurry is a typical of finishing composition. Finishing compositions have their pH adjusted carefully, and generally comprise other chemical additives are used to effect chemical reactions and/other surface changes to the workpiece. A finishing composition having dissolved chemical additives is particularly preferred. Illustrative examples preferred dissolved chemical additives include dissolved acids, bases, buffers, oxidizing agents, reducing agents, stabilizers, and chemical reagents. A finishing composition which substantially reacts with material from the workpiece surface being finished is particularly preferred. A finishing composition which selectively chemically reacts with only a portion of the workpiece surface is particularly preferred. A finishing composition which preferentially chemically reacts with only a portion of the workpiece surface is particularly preferred.

As used herein, a finishing slurry is finishing composition which contains abrasive particles are used for either or both planarizing and polishing. As used herein, a planarizing slurry is a finishing composition which contains abrasive particles used for planarizing. As used herein, a polishing slurry is finishing composition which contains abrasive particles used for polishing. The chemical mechanical polishing industry often does not consistently differentiate between polishing slurries and planarizing slurries. As used herein and for that reason, a chemical mechanical polishing slurry is used for both a planarizing slurry and a polishing slurry.

An abrasive particle having a Knoops hardness of less than diamond is particularly preferred to reduce microscratches on workpiece surface being finished and a Knoops hardness of less than 50 GPa is more particularly preferred and a Knoops hardness of less than 40 GPa is even more particularly preferred and a Knoops hardness of less than 35 GPa is especially particularly preferred. An abrasive particle having a Knoops hardness of at least 1.5 GPa is preferred and having a Knoops hardness of at least 2 is preferred. An abrasive particle having a Knoops hardness of from 1.5 to 50 GPa is preferred and having a Knoops hardness of from 2 to 40 GPa is preferred and having a Knoops hardness of from 2 to 30 GPa is even more preferred. A slurry having a plurality of abrasive particles having at least two different Knoops hardnesses can be preferred.

Some illustrative nonlimiting examples of polishing slurries which can be used and/or modified by those skilled in the art are now discussed. An example slurry comprises water, a solid abrasive material and a third component selected from the group consisting of $HNO_3$, $H_2SO_4$, and $AgNO_3$ or mixtures thereof Another polishing slurry comprises water, aluminum oxide, and hydrogen peroxide mixed into a slurry. Other chemicals such as KOH (potassium hydroxide) can also be added to the above polishing slurry. Still another illustrative polishing slurry comprises $H_3PO_4$ at from about 0.1% to about 20% by volume, $H_2O_2$ at from 1% to about 30% by volume, water, and solid abrasive material. Still another polishing slurry comprises an oxidizing agent such as potassium ferricyanide, an abrasive such as silica, and has a pH of between 2 and 4. Still another polishing slurry comprises high purity fine metal oxides particles uniformly dispersed in a stable aqueous medium. Still another polishing slurry comprises a colloidal suspension of $SiO_2$ particles having an average particle size of between 20 and 50 nanometers in alkali solution, demineralized water, and a chemical activator. U.S. Pat. No. 5,209,816 to Yu et. al. issued in 1993, U.S. Pat. No. 5,354,490 to Yu et. al. issued in 1994, U.S. Pat. No. 5,5408,810 to Sandhu et. al. issued in 1996, U.S. Pat. No. 5,516,346 to Cadien et. al. issued in 1996, U.S. Pat. No. 5,527,423 to Neville et. al. issued in 1996, U.S. Pat. No. 5,622,525 to Haisma et. al. issued in 1997, and U.S. Pat. No. 5,645,736 to Allman issued in 1997 comprise illustrative nonlimiting examples of slurries contained herein for further general guidance and modification by those skilled in the arts. Commercial CMP polishing slurries are also available from Rodel Manufacturing Company in Newark, Del.

Lubricants

A method to add lubricants with a fluid can be particularly preferred because the amount and timing can be controlled for the particular finishing at hand. Fluid based lubricants can be preferred for finishing when a finishing pad finishing surface is employed. A water based lubricant is preferred because of environmental friendliness reasons. A water based lubricant can also reduce concerns for contamination in the clean room fabrication of semiconductor wafers. A water based lubricant formed with purified water is preferred and deionized water is particularly preferred. A water based lubricant formed with water which has low sodium content is also preferred because sodium can have a adverse performance effect on the preferred semiconductor parts being made. A lubricating fluid free of sodium is a preferred lubricating fluid. As used herein a lubricating fluid free of sodium means that the sodium content is below the threshold value of sodium which will adversely impact the performance of a semiconductor wafer or semiconductor parts made therefrom.

Some preferred water borne lubricants are now discussed. An oil in water emulsion is a preferred water borne lubricant. Generally a oil in water emulsion contains a surfactant or emulsifier to aid the emulsion stability. A preferred oil is a mineral oil. Another preferred oil is a vegetable oil. General parameters to control during the formation of an emulsion include water temperature, rate of oil addition to the water, and mixing methods. A general temperature range is to adjust the water temperature from about 50 degrees centigrade to about 80 degrees centigrade. Those skilled in the emulsion arts can readily make oil in water emulsions. A water soluble lubricant in water is a more preferred water borne lubricant. Water soluble lubricants can be easier to clean from the surface of finished parts thus making them more preferable for some applications. Although water in oil emulsions are known along with the processes of making them, oil in water emulsions are preferred because they are more easily cleaned from the workpiece and are currently considered to be more environmentally friendly. Some preferred examples will now be described with more particularity.

Supplying a lubricant at least a portion of the finishing cycle time is preferred, particularly where polishing of the workpiece surface is important.

Supplying an effective amount of lubricant which reduces the coefficient of friction between the finishing element finishing surface and the workpiece surface being finished is preferred. Supplying an effective amount of lubricant which reduces the unwanted surface damage to the surface of the workpiece being finished during finishing is preferred. Supplying an effective amount of lubricant which differentially lubricates different regions of the work piece and reduces the unwanted surface damage to at least a portion of the surface of the workpiece being finished during finishing is preferred.

Changing the lubrication at least once during the finishing cycle time to change the coefficient of friction between the finishing element finishing surface and the workpiece surface being finished is preferred. Changing the lubrication a plurality of times during the finishing cycle time to change the coefficient of friction between the finishing element finishing surface and the workpiece surface being finished a plurality of times during the finishing cycle time is more preferred. Changing the amount of lubricant at the operative finishing interface is a preferred method to change the lubrication. Changing the composition of the lubricant at the operative finishing interface is a preferred method to change the lubrication. Changing the number of lubricants at the operative finishing interface is a preferred method to change the lubrication. Changing the number of organic lubricating boundary layers at the operative finishing interface is a preferred method to change the lubrication. Changing the composition of organic lubricating boundary layer(s) at the operative finishing interface is a preferred method to change the lubrication. Changing the form of the organic lubricating boundary layer(s) is a preferred method to change the lubrication. Supplying an effective amount of lubricant which reduces the unwanted surface damage to the surface of the workpiece being finished during finishing is preferred. Changing the lubrication during the finishing cycle time can improve finishing control and improve finishing performance, particularly where using in situ control as discussed elsewhere herein. Changing lubrication in situ with a control subsystem is particularly preferred. Changing the coefficient of friction in a uniform region of the workpiece is preferred and changing the coefficient of friction in a plurality of uniform regions of the workpiece is more preferred.

The lubricants can help reduce the formation of surface defects for high precision part finishing. Fluid based lubricants can help reduction of brittle fracture at the workpiece surface being finished. A method of finishing which adds an effective amount of fluid based lubricant is preferred. A preferred effective amount of fluid based lubricant can reduce the occurrence of unwanted surface defects. A preferred effective amount of fluid based lubricant reduces the coefficient of friction between the work piece surface being finished and the finishing element finishing surface.

A fluid based lubricant which is water soluble is preferred. A fluid based lubricant which is more soluble in hot water is more preferred. A fluid based lubricant which is substantially more soluble in hot water is even more preferred. A water based lubricant is more preferred. A degradable lubricant is also preferred and a biodegradable lubricant is even more preferred. Certain finishing process are designed to recycle the finishing composition and for these, a lubricant which is stable to recycling conditions is preferred. Certain particularly important workpieces in the semiconductor industry have regions of high conductivity and regions of low conductivity. The higher conductivity regions are often comprised of metallic materials such as tungsten, copper, aluminum, and the like. An illustrative example of a common lower conductivity region is silicon and silicon oxide. A fluid based lubrication which differentially lubricates the two regions is preferred and a fluid based lubricant which substantially differentially lubricates two regions is more preferred. An example of a differential lubrication is if the coefficient of friction is changed by different amounts in one region versus the other region during finishing. An example of differential lubrication is where the boundary lubricant reacts differently with different chemical compositions to create regions having different local regions of tangential friction force and different coefficients of friction. Another example is where the semiconductor surface being finished topography (for instance unwanted raised regions) interact within the operative finishing interface to create local regions having different tangential friction forces and different coefficients of friction (see for example FIG. 4 discussion herein). For instance one region (or area) can have the coefficient of friction reduced by 20% and the other region (or area) reduced by 40%. This differential change in lubrication can be used to help in differential finishing of the two regions. An example of differential finishing is a differential finishing rate between the two regions. For example, a first region can have a finishing rate of "X" angstroms/minute and a second region can have a finishing rate of "Y" angstroms per minute before lubrication and after differential lubrication, the first region can have a finishing rate of 80% of "X" and the second region can have a finishing rate of 60% of "Y". An example of where this will occur is when the lubricant tends to adhere to one region because of physical or chemical surface interactions (such as a metallic conductive region) and not adhere or not adhere as tightly to the an other region (such as a non metallic, non conductive region). Different regions can have different lubricating boundary layer thicknesses. Changing the finishing control parameters to change the differential lubrication during finishing of the workpiece is a preferred method of finishing. Changing the finishing control parameters to change the differential lubrication during finishing of the workpiece which in turn changes the region finishing rates in the workpiece is a more preferred method of finishing. Changing the finishing control parameters with in situ process control to change the differential lubrication during finishing of the workpiece which in turn changes the region finishing rates in the workpiece is an even more preferred method of finishing. A secondary friction sensor probe can aid in an important way in detecting and controlling differential lubrication in the workpieces having heterogeneous surface compositions needing finishing.

An organic lubricating boundary layer which interacts with the semiconductor wafer surface is preferred. An organic lubricating boundary layer which adheres to the semiconductor wafer surface is preferred. An organic lubricating boundary layer which interacts with and adheres to the semiconductor wafer surface is more preferred. An organic lubricating boundary layer which interacts with the uniform region of the semiconductor wafer surface is preferred. An organic lubricating boundary layer which adheres. to the uniform region of the semiconductor wafer surface is preferred. An organic lubricating boundary layer which interacts with and adheres to the uniform region of the semiconductor wafer surface is more preferred. A uniform functional region is a preferred uniform region. A conductive region is a preferred uniform functional region. A nonconductive region is a preferred uniform functional region. By having the organic boundary lubricating layer interact with and adhere to a uniform region of the semiconductor wafer surface, localized finishing control can be improved and unwanted surface defects can generally be reduced using the teaching and guidance herein.

A lubricant comprising a reactive lubricant is preferred. A lubricant comprising a boundary lubricant is also preferred. A reactive lubricant is a lubricant which chemically reacts with the workpiece surface being finished. A boundary layer lubricant is a preferred example of a lubricant which can form a lubricating film on the surface of the workpiece surface. As used herein a boundary lubricant is a thin layer on one or more surfaces which prevents or at least limits, the formation of strong adhesive forces between the workpiece being finished and the finishing element finishing surface and therefore limiting potentially damaging friction junctions between the workpiece surface being finished and the finishing element finishing surface. A boundary layer film has a comparatively low shear strength in tangential loading which reduces the tangential force of friction between the workpiece being finished and the finishing element finishing surface which can reduce surface damage to the workpiece being finished. In other words, boundary lubrication is a lubrication in which friction between two surfaces in relative motion, such as the workpiece surface being finished and the finishing element finishing surface, is determined by the properties of the surfaces, and by the properties of the lubricant other than the viscosity. Organic lubrication layers wherein the friction between two surfaces is dependent on lubricant properties other than viscosity is preferred. Different regional boundary layers on a semiconductor wafer surface being finished can be preferred for some finishing—particularly planarizing. A boundary film generally forms a thin film, perhaps even several molecules thick, and the boundary film formation depends on the physical and chemical interactions with the surface. A boundary lubricant which forms of thin film is preferred. A boundary lubricant forming a film having a thickness from 1 to 10 molecules thick is preferred and a boundary lubricant forming a film having a thickness from 1 to 6 molecules thick is more preferred and a boundary lubricant forming a film having a thickness from 1 to 4 molecules thick is even more preferred. A boundary lubricant forming a film having a thickness of at most 10 molecules thick on at least a portion of the workpiece surface being finished is particularly preferred and a boundary lubricant forming a film having a thickness of at most 6 molecules thick on at least a portion of the workpiece surface being finished is more particularly preferred and a boundary lubricant forming a film having a thickness of at most 4 molecules thick on at least a portion of the workpiece surface being finished is even more particularly preferred. An operative motion which continues in a substantially uniform direction can improve boundary layer formation and lubrication. A discontinuous operative motion can be used to change the lubricating boundary layer. Friction sensor subsystems and finishing sensor subsystems having the ability to control the friction probe motions and workpiece motions are preferred and uniquely able to improve finishing in many real time lubrication changes to the operative finishing interface. Boundary lubricants, because of the small amount of required lubricant, are particularly effective lubricants for inclusion in finishing elements. The molecular thickness of lubricating boundary layers can be measured with generally known frictional force measures and/or energy change sensors discussed herein. Controls can also be used by using various generally known analytical techniques such as spectroscopy and these results used to calibrate target energy change sensors and frictional force measures. Changing the pressure in the operative finishing interface and/or in the secondary friction sensor interface can be used to determine molecular thickness. Secondary friction sensors can be used to help measure the boundary layer thickness. Thermal analysis can also be used to measure the quantity of organic boundary layer on a surface and then the thickness calculated. Thermal analysis can be used to determine the efficacy of a particular lubricating boundary layer including solid boundary lubricant zone, boundary liquid lubricant zone, and boundary lubricant desorbed zone and the transition temperatures therebetween.

Heterogeneous lubricating boundary layers can improve finishing and planarizing of some semiconductor wafers where a differential finishing rate is desired in different regions. A semiconductor wafer surface having at least one unwanted raised region wherein the lubricating boundary layer thickness is at most one half the molecular layer thickness of the lubricating boundary layer thickness proximate to the unwanted raised region is preferred. A semiconductor wafer surface having at least one unwanted raised region wherein the boundary lubrication thickness is at most one third the molecular layer thickness of the lubricating boundary layer thickness proximate to the unwanted raised region is more preferred. A semiconductor wafer surface having at least one unwanted raised region wherein the lubricating boundary layer thickness is at most one quarter the molecular layer thickness of the lubricating boundary layer thickness proximate to the unwanted raised region is more preferred. Applications of this technology are further discussed herein elsewhere.

Controlling the thickness of the lubricating boundary layer by changing at least one control parameter in a manner that changes the tangential force of friction in at least one region of the semiconductor wafer surface in response to an in situ control signal is preferred. Controlling the thickness of the lubricating boundary layer by changing at least one control parameter in a manner that changes the tangential force of friction in at least two different regions of the semiconductor wafer surface in response to an in situ control signal is more preferred. Preferably the unwanted raised regions are related to a repeating pattern in the semiconductor wafer die. A plurality of die each having the same repeating pattern on the semiconductor wafer surface being finished is more preferred. These repeating patterns are generally created during semiconductor wafer manufacture and can be related to pattern densities. This is because small changes in lubricating boundary layers can change finishing rate, finishing rate selectivity, and finished surface quality.

A reactive boundary lubricant is a preferred lubricant. A lubricating boundary layer comprising physical adsorption (physisorption) of the lubricant molecules to the semiconductor surface being finished is a preferred lubricating boundary layer. Van der Waals surface forces are a preferred example of physical adsorption. Dipole-dipole interaction between the boundary lubricant and the semiconductor wafer surface being finished is a preferred example of physical adsorption. A reversible dipole-dipole interaction between the boundary lubricant and the semiconductor wafer surface is an example of a more preferred physical adsorption lubricating boundary layer. An organic alcohol is an illustrative preferred example. A polar organic molecule containing the hetereoatom oxygen is preferred. An organic boundary lubricating layer which is a solid film generally has a greater ability to separate the finishing element finishing surface from the semiconductor wafer surface being finished. A heat of adsorption of from 2,000 to 10,000 cal/mole is preferred for physisorption. A physisorption organic boundary lubricating layer is a preferred reversible lubricating layer.

A lubricating boundary layer comprising chemisorption of lubricant molecules to the semiconductor wafer being finished is a preferred lubricating boundary layer. In chemisorption, chemical bonds hold the boundary lubricants to the semiconductor wafer surface being finished. As an illustrative example, a reaction of stearic acid forms a "metal soap" thin film on a metal surface. An organic carboxylic acid is a preferred example. Further, the "metal soap" can have a higher melting temperature and thus form regional areas of an organic boundary layer having higher temperature lubricating capacity as discussed further herein below. A heat of absorption of between 10,000 to 100,000 cal/mole is preferred for chemisorption.

A solid film organic boundary lubricating layer generally has a greater ability to separate the finishing element finishing surface from the semiconductor wafer surface being finished. A solid film organic boundary lubricating layer can thus help reduce finishing rates as measured in angstroms per minute (compared to a liquid film). A liquid film organic boundary lubricating layer generally has a lower ability to separate the finishing element finishing surface from the semiconductor wafer surface being finished can thus help increase finishing rates as measured in angstroms per minute (compared to a solid film). The same boundary lubricant can form either solid film organic boundary lubricating layer or a liquid film organic boundary lubricating layer depending on the operative finishing interface process conditions. A reversible organic boundary lubricating layer (which can change from solid to liquid to solid depending on processing conditions such as temperature) is preferred. Finishing a heterogeneous semiconductor wafer surface having at least one unwanted raised region wherein the lubricating boundary layer comprises a liquid film on the unwanted raised region and the lubricating boundary layer comprises a solid film in the region below and proximate to the unwanted raised region is preferred. Finishing a heterogeneous semiconductor wafer surface having at least one unwanted raised region wherein the lubricating boundary layer comprises a higher temperature liquid film on the unwanted raised region and the lubricating boundary layer comprises a lower temperature solid film in the region below and proximate to the unwanted raised region is preferred. Applying an operative finishing motion to the operative finishing interface forming a heterogeneous temperature profile on the semiconductor wafer surface being finishing and wherein the temperature is higher on a plurality of unwanted raised regions of the heterogeneous semiconductor wafer surface and the temperature is lower proximate to and below the plurality of unwanted raised regions of the heterogeneous semiconductor wafer surface and further the plurality of unwanted raised regions have a liquid lubricating films on them and the regions proximate to and below the plurality of unwanted raised regions solid lubricating films on them. See for instance Reference Numerals 802 (unwanted raised region) and 804 (region proximate to and below the unwanted raised region) for further helpful guidance. An example is octadecyl alcohol forms a solid lubricant film on copper at about 20 to 55 degrees centigrade and a liquid film on copper at about 65 to 110 degrees centigrade. An organic boundary lubricating layer that is capable of changing from a solid film to a liquid film in the operative finishing interface temperature range during a finishing cycle time is preferred. An organic boundary lubricating layer that is capable of changing from a solid film to a different physical form in the operative finishing interface temperature range during a finishing cycle time is preferred. An organic boundary lubricating layer that is capable of changing from a liquid film to a different physical form in the operative finishing interface temperature range during a finishing cycle time is preferred. An organic boundary lubricating layer that is capable of changing from a solid film to a liquid film in the temperature range from 20 to 100 degrees centigrade is more preferred. By increasing the finishing rate in the unwanted raised region and lowering the finishing rate in the region proximate to and below the unwanted raised region, planarization can be improved. Changing the lubricating boundary layer film physical form by changing at least one lubrication control parameter in situ based on feed back information from a lubrication control subsystem having an energy change sensor is preferred. Controlling the lubricating boundary layer film physical form by changing at least one lubrication control parameter in situ based on feed back information from a lubrication control subsystem having an energy change sensor is more preferred. Increasing temperature on the unwanted raised region on the semiconductor wafer surface compared to the temperature on the region below the unwanted raised region forming the lubricating boundary layer liquid film on the unwanted raised region and the lubricating boundary layer solid film on at least a portion of the semiconductor wafer surface below the raised region is preferred. Increasing temperature with frictional heat on the unwanted raised region on the semiconductor wafer surface compared to the temperature on the region below the unwanted raised region forming the lubricating boundary layer liquid film on the unwanted raised region and the lubricating boundary layer solid film on at least a portion of the semiconductor wafer surface below the raised region is more preferred. Using and controlling the lubricating boundary layer physical form can help customize finishing for the particular semiconductor wafers needing finishing. The operative motion interacts with the lubricating boundary layer in a new and useful way to finish a workpiece surface, preferably a semiconductor wafer surface.

A boundary lubricant which forms a thin lubricant film on the metal conductor portion of a workpiece surface being finished is particularly preferred. A nonlimiting preferred group of example boundary lubricants include at least one lubricant selected from the group consisting of fats, fatty acids, esters, and soaps. A preferred group of boundary lubricants comprise organic boundary lubricants. Another preferred group of boundary lubricants comprise organic synthetic lubricants. A phosphorous containing compound can be an effective preferred boundary lubricant. A phosphate ester is an example of a preferred phosphorous containing compound which can be an effective boundary lubricant. A chlorine containing compound can be an effective preferred boundary lubricant. A sulfur containing compound can be an effective preferred boundary lubricant. A nitrogen containing compound can be an effective preferred boundary lubricant. An amine derivative of a polyglycol can be a preferred boundary lubricant. A diglycol amine is a preferred amine derivative of a polyglycol. A compound containing atoms selected from the group consisting of at least one of the following elements oxygen, fluorine, nitrogen, or chlorine can be a preferred lubricant. A compound containing atoms selected from the group consisting of at least two of the following elements oxygen, fluorine, nitrogen, or chlorine can be a more preferred lubricant. A synthetic organic polymer containing atoms selected from the group consisting of at least one of the following elements oxygen, fluorine, nitrogen, or chlorine can be a preferred lubricant. A synthetic organic polymer containing atoms selected from the group consisting of at least two of the following elements oxygen, fluorine, nitrogen, or chlorine can be a more preferred lubricant. A lubricant free of sodium is a preferred lubricant. As used herein a lubricant free of sodium means that the sodium content is below the threshold value of sodium which will adversely impact the performance of a semiconductor wafer or semiconductor parts made therefrom. A synthetic organic polymer containing atoms selected from the group consisting of at least two of the following elements oxygen, fluorine, nitrogen, or chlorine can be a preferred lubricant. A sulfated vegetable oil and sulfurized fatty acid soaps are preferred examples of a sulfur containing compound. A lubricant which reacts physically with at least a portion of the workpiece surface being finished is a preferred lubricant. A lubricant which reacts chemically with at least a portion of the workpiece surface being finished is often a more preferred lubricant because it is often a more effective lubricant and can also aid at times directly in the finishing. A lubricant which reacts chemically with at least a portion of the workpiece surface being finished and which is non-staining is a particularly preferred lubricant because it is often a more effective lubricant, is generally easily cleaned from the workpiece, and can also aid directly in the finishing as discussed herein.

A marginally effective lubricant between the workpiece being finished and the finishing element finishing surface is preferred. As used herein, a marginally effective lubricant is a lubricant and amount which does not perfectly lubricant and stop all wear but allows some wear while reducing or eliminating especially deleterious wear.

Limited zone lubrication between the workpiece being finished and the finishing element finishing surface is preferred. As used herein, limited zone lubricating is lubricating to reduce friction between two surfaces while simultaneously having wear occur. Limited zone lubricating which simultaneously reduces friction between the operative finishing interface while maintaining an average cut rate or regional cut rate on the workpiece surface being finished is preferred. Limited zone lubricating which simultaneously reduces friction between the operative finishing interface while maintaining an acceptable cut rate on the workpiece surface being finished is more preferred. Limited zone lubricating which simultaneously reduces friction between the operative finishing interface while maintaining a finishing rate on the workpiece surface being finished is preferred. Limited zone lubricating which simultaneously reduces friction between the operative finishing interface while maintaining an acceptable finishing rate on the workpiece surface being finished is more preferred. Limited zone lubricating which simultaneously reduces friction between the operative finishing interface while maintaining a planarizing rate on the workpiece surface being finished is preferred. Limited zone lubricating which simultaneously reduces friction between the operative finishing interface while maintaining an acceptable planarizing rate on the workpiece surface being finished is more preferred. Limited zone lubricating which simultaneously reduces friction between the operative finishing interface while maintaining a polishing rate on the workpiece surface being finished is preferred. Limited zone lubricating which simultaneously reduces friction between the operative finishing interface while maintaining an acceptable polishing rate on the workpiece surface being finished is preferred. Lubricant types and concentrations are preferably controlled during limited zone lubricating. Limited zone lubricating offers the advantages of controlled wear along with reduced unwanted surface damage.

Lubricants which are polymeric can be very effective lubricants. A boundary lubricant comprising organic synthetic polymers are preferred lubricants. Supplying a lubricant to the interface of the workpiece surface being finished and the finishing element finishing surface wherein the lubricant is from 0.1 to 15% by weight of the total fluid between the interface is preferred and from 0.2 to 12% by weight of the total fluid between the interface is more preferred and from 0.3 to 12% by weight of the total fluid between the interface is even more preferred and from 0.3 to 9% by weight of the total fluid between the interface is even more particularly preferred. These preferred ranges are given for general guidance and help to those skilled in the art. Lubricants outside this range are currently believed to be useful but not as economical to use.

A lubricant having functional groups containing elements selected from the group consisting of chlorine, sulfur, nitrogen, and phosphorous is preferred and a boundary lubricant having functional groups containing elements selected from the group consisting of chlorine, sulfur, nitrogen, and phosphorous is more preferred. A lubricant comprising a fatty acid substance is a preferred lubricant. An preferred example of a fatty substance is a fatty acid ester or salt. Fatty acid salts of plant origin can be particularly preferred. A lubricant comprising a synthetic polymer is preferred and a lubricant comprising a boundary lubricant synthetic polymer is more preferred and a lubricant comprising a boundary lubricant synthetic polymer and wherein the synthetic polymer is water soluble is even more preferred. A polymer having a number average molecular weight from 400 to 150,000 is preferred and having a number average molecular weight from 1,000 to 100,000 is more preferred and having a number average molecular weight from 1,000 to 50,000 is even more preferred.

A lubricant comprising a polyalkylene glycol polymer is a preferred composition. A polymer of polyoxyalkylene glycol monoacrylate or polyoxyalkylene glycol monomethacrylate is very useful as a lubricant. A fatty acid ester can be an effective lubricant. A polyethylene glycol having a molecular weight of 400 to 1000 can be an effective lubricant. Synthetic oligomers can be an effective lubricant. A lubricant comprising a fatty acid ester or salt and cyclodextrin and derivatives of cyclodextrin is a preferred lubricant. A lubricant comprising salts formed from metals, an organic amine or amomnia and aliphatic saturated or unsaturated fatty acid having from 8 to 25 carbon atoms is a preferred. An ester formed from at least one acid selected from the group consisting essentially of lauric, myristic, palmitic, stearic, hydroxystearic, arachidic, behenic, erucic, lignoceric, citric and lactic, and at least one alcohol selected from the group consisting essentially of lauryl, myristyl, palmityl, stearyl, arachidyl, behenyl, erucyl, lignoceryl, glycerol, polyglycerol, trimethylolpropane, ethylene glycols, propylene glycols, sorbitols and polysorbitols is preferred and wherein the ester formed has a melting point of above 100 degrees C. is more preferred and wherein the ester formed is soluble in hot water is even more preferred. An ester formed from the groups selected from the group consisting essentially of ethoxylated C12–C18 fatty acids having 2–10 moles of ethylene oxide and ethoxylated C9–C18 fatty alcohols having 2–10 moles of ethylene oxide is preferred and wherein the ester has a melting point of greater than 100 degrees C. is more preferred and wherein the ester is hot water soluble is even more preferred. An ethoxylated long chain ester is a preferred lubricant. A lubricant selected from the group consisting of an ester of pentaerythritol, a fatty acid ester, a trimethylolpropane ester, a dimer diol ester, and mixtures thereof is a preferred lubricant. A glycol etherol is a preferred lubricant. A polyalkylene glycol polymer is a preferred lubricant. A lubricant comprising polyaspartic acid and salts thereof are preferred. Polyaspartic acid and salts are generally biodegradable.

A lubricant material selected from the group consisting of an ester of pentacrythritol, a fatty acid ester, a trimethylolpropane ester, a dimer diol ester, and mixtures thereof can be preferred for some applications. Still another group of lubricants include a lubricant comprising using a polycarboxlyic acid esters of C4 to C10 monohydric alcohols and polyhydric alcohols. A lubricant comprising fatty acids containing from C8 to C22 carbon atoms and ester derivatives thereof A lubricant containing from 6 to 24 carbon atoms and consisting of elements selected from the group consisting of carbon, hydrogen, and oxygen is preferred. A lubricant containing from 6 to 24 carbon atoms and consisting of elements selected from the group consisting of carbon, hydrogen, nitrogen, and oxygen is more preferred. A lubricant comprising an aliphatic alcohol is preferred. A lubricant aliphatic carboxylic acid is also preferred. Examples of fatty acids include caproic, caprylic, capric, lauric, myristic, palmitic, stearic, palmitoliec, oleic, erucic, and linoleic acids. Examples of polyhydric alcohols include ethylene glycol, diethylene glycol, triethylene glycol, and hexylene glycol. As used herein, the shorthand C4–C10 means a carbon chain from 4 to 10 carbons long and is generally known to those skilled in the art. Lubricants of this type can generally provide good lubricity and be cleaned from the workpiece surface using aqueous solutions.

Another group of lubricants for use in this invention consist of lubricants selected from the group consisting of vegetable and animal oils, fats, tallows, and waxes or mixtures thereof Another group of suitable lubricants include lubricants selected from the group consisting of mineral and synthetic lubricants. Non limiting examples of preferred synthetic lubricants include aliphatic and aromatic carboxylates, polymeric esters, and polyalkene oxides. Still another group of preferred lubricants include lubricants selected from the group consisting of poly alpha-olefins, ester based lubricants, phosphates, and polyalkyleneglycols and mixtures thereof with water. Another group of preferred boundary lubricants consists of lubricants selected from the group consisting of lard oil, overbased sulfonates, esters, soaps, and sulfated oils. Water based oils can preferably contain naphthenic or paraffinic oil with viscosities of at most 130 SUS (Saybolt universal seconds) at 100 degrees Fahrheit.

The aqueous based lubricants can also preferably have corrosion inhibitors. Copper corrosion inhibitors are particularly preferred as are aluminum corrosion inhibitors. Non-limiting preferred examples of copper corrosion inhibitors include benzyl-triazole and tolytriasole.

Non limiting illustrative examples of lubricants are included in U.S. Pat. No. 4,332,689 to Tanizaki, U.S. Pat. No. 4,522,733 to Jonnes, U.S. Pat. No. 4,544,377 to Schwen, U.S. Pat. No. 4,636,321 to Kipp et. al., U.S. Pat. No. 4,767,554 to Malito et. al., U.S. Pat. No. 4,950,415 to Malito, U.S. Pat. No. 5,225,249 to Biresaw, U.S. Pat. No. 5,368,757 to King, U.S. Pat. No. 5,401,428 to Kalota, U.S. Pat. No. 5,433,873 to Camenzind, U.S. Pat. No. 5,496,479 to Videau et. al., and U.S. Pat. No. 5,614,482 to Baker et. al. are included for guidance and modification by those skilled in the art and are included by reference in their entirety herein. Some preferred suppliers of lubricants include Dow Chemical, Huntsman Corporation, and Chevron Corporation.

Guidance on lubricant performance can be ascertained during finishing and controlled. Further discussions of in situ procession control are also discussed herein.

Generally those skilled in the art know how to measure the kinetic coefficient of friction. A preferred method is ASTM D 3028-95 and ASTM D 3028-95 B is particularly preferred. Those skilled in the art can modify ASTM D 3028-95 B to adjust to appropriate finishing velocities and to properly take into consideration appropriate fluid effects due to the lubricant and finishing composition. Preferred lubricants and finishing compositions do not corrode the workpiece or localized regions of the workpiece. Corrosion can lead to workpiece failure even before the part is in service. ASTM D 130 is a is a useful test for screening lubricants for particular workpieces and workpiece compositions. As an example a metal strip such as a copper strip is cleaned and polished so that no discoloration or blemishes detectable. The finishing composition to be tested is then added to a test tube, the copper strip is immersed in the finishing composition and the test tube is then closed with a vented stopper. The test tube is then heated under controlled conditions for a set period of time, the metal strip is removed, the finishing composition removed, and the metal strip is compared to standards processed under identical conditions to judge the corrosive nature and acceptableness of the finishing composition. ASTM D 1748 can also be used to screen for corrosion. These test methods are included herein by reference in their entirety.

Supplying an effective marginal lubrication to the interface between the workpiece surface being finished and the finishing element finishing surface is preferred and supplying an effective marginal boundary lubrication to the interface between the workpiece surface being finished and the finishing element finishing surface is more preferred. Marginal lubrication is less than complete lubrication and facilitates controlling frictional wear and tribochemical reactions. Independent control of the lubricant control parameters aids in controlling an effective amount of marginal lubrication and in situ control of the lubricant control parameters is more preferred.

Operative Finishing Motion

Chemical mechanical finishing during operation has the finishing element in operative finishing motion to the surface of the workpiece being finished. A relative lateral parallel motion of the finishing element to the surface of the workpiece being finished is an operative finishing motion. Lateral parallel motion can be over very short distances or macro-distances. A parallel circular motion of the finishing element relative to the workpiece surface being finished can be effective. A tangential finishing motion can also be preferred. U.S. Pat. No. 5,177,908 to Tuttle issued in 1993, U.S. Pat. No. 5,234,867 to Schultz et. al. issued in 1993, U.S. Pat. No. 5,522,965 to Chisholm et. al. issued in 1996, U.S. Pat. No. 5,735,731 to Lee in 1998, and U.S. Pat. No. 5,962,947 to Talieh issued in 1997 comprise illustrative nonlimiting examples of operative finishing motion contained herein for further general guidance of those skilled in the arts.

Some illustrative nonlimiting examples of preferred operative finishing motions for use in the invention are also discussed. This invention has some particularly preferred operative finishing motions of the workpiece surface being finished and the finishing element finishing surface. Moving the finishing element finishing surface in an operative parallel finishing motion to the workpiece surface being finished is a preferred example of an operative finishing motion. Moving the workpiece surface being finished in an operative parallel finishing motion to the finishing element finishing surface is a preferred example of an operative finishing motion. Moving the finishing element finishing surface in a parallel circular motion to the workpiece surface being finished is a preferred example of an operative finishing motion. Moving the workpiece surface being finished in a parallel circular motion to the finishing element finishing surface is a preferred example of an operative parallel. Moving the finishing element finishing surface in a parallel linear motion to the workpiece surface being finished is a preferred example of an operative finishing motion. Moving the workpiece surface being finished in a parallel linear motion to the finishing element finishing surface is a preferred example of an operative parallel. The operative finishing motion performs a significant amount of the polishing and planarizing in this invention.

High speed finishing of the workpiece with finishing elements can cause surface defects in the workpiece surface being finished at higher than desirable rates because of the higher forces generated. As used herein, high speed finishing involves relative operative motion having an equivalent linear velocity of greater than 300 feet per minute and low speed finishing involves relative operative motion having an equivalent linear velocity of at most 300 feet per minute. The relative operative speed is measured between the finishing element finishing surface and the workpiece surface being finished. Supplying a lubricant between the interface of finishing element finishing surface and the workpiece surface being finished when high speed finishing is preferred to reduce the level of surface defects. Supplying a lubricant between the interface of a cylindrical finishing element and a workpiece surface being finished is a preferred example of high speed finishing. Supplying a lubricant between the interface of a belt finishing element and a workpiece surface being finished is a preferred example of high speed finishing. Nonlimiting illustrative examples of a belt finishing element and a cylindrical finishing element are found in patents U.S. Pat. No. 5,735,731 to Lee and U.S. Pat. No. 5,762,536 to Pant and which can be modified by those skilled in the art as appropriate. U.S. Pat. No. 5,735,731 to Lee and U.S. Pat. No. 5,762,536 to Pant are included herein by reference in their entirety.

Platen

The platen is generally a stiff support structure for the finishing element. The platen surface facing the workpiece surface being finished is parallel to the workpiece surface being planarized and is flat and generally made of metal. The platen reduces flexing of the finishing element by supporting the finishing element, optionally a pressure distributive element can also be used. The platen surface during polishing is in operative finishing motion to the workpiece surface being finished. The platen surface can be static while the workpiece surface being finished is moved in an operative finishing motion. The platen surface can be moved in a parallel motion fashion while the workpiece surface being finished is static. Optionally, both the platen surface and the workpiece being finished can be in motion in a way that creates operative finishing motion between the workpiece and the finishing element. Other types of platens are generally known in the industry and functional.

Base Support Structure

The base support structure forms structure which can indirectly aid in applying pressure to the workpiece surface being finished. It generally forms a support surface for those members attached to it directly or operatively connected to the base support structure. Other types of base support structure are generally known in the industry and functional.

Workpiece Finishing Sensor

A workpiece finishing sensor is a sensor which senses the finishing progress to the workpiece in real time so that an in situ signal can be generated. A workpiece finishing sensor is preferred. A workpiece finishing sensor which facilitates measurement and control of finishing in this invention is preferred. A workpiece finishing sensor probe which generates a signal which can be used cooperatively with the secondary friction sensor signal to improve finishing is more preferred.

The change in friction during finishing can be accomplished using technology generally familiar to those skilled in the art. A change in friction can be detected by rotating the workpiece being finished and the finishing element finishing surface with electric motors and measuring current changes on one or both motors. The current changes related to friction changes can then be used to produce a signal to operate the finishing control subsystem. A change in friction can be detected by rotating the workpiece finishing surface with the finishing element finishing surface with electric motors and measuring power changes on one or both motors. Changes in friction can also be measured with thermal sensors. A thermistor is a non-limiting example of preferred non-optical thermal sensor. A thermal couple is another preferred non-optical thermal sensor. An optical thermal sensor is a preferred thermal sensor. A infrared thermal sensor is a preferred thermal sensor. A sensors to measure friction in workpieces being finished are generally known to those skilled in the art. Energy change sensors are a preferred type of sensor for feed back of in situ control information. Non limiting examples methods to measure friction in friction sensor probes are described in the following U.S. Pat. No. 5,069,002 to Sandhu et. al., U.S. Pat. No. 5,196,353 to Sandhu, U.S. Pat. No. 5,308,438 to Cote et. al., U.S. Pat. No. 5,595,562 to Yau et. al., U.S. Pat. No. 5,597,442 to Chen, U.S. Pat. No. 564,050 to Chen, and U.S. Pat. No. 5,738,562 to Doan et. al. and are included by reference herein in their entirety for guidance and can be advantageously modified by those skilled in the art for use in this invention. Thermal sensors are available commercially from Terra Universal, Inc. in Anaheim, Calif. and Hart Scientific in American Fork, Utah. Measuring the changes in friction at the interface between the workpiece being finished and the finishing element finishing surface to generate an in situ signal for control is particularly preferred because the it can be effectively combined with the a secondary friction sensor further improve finishing control.

A workpiece finishing sensor for the workpiece being finished is preferred. A sensor for the workpiece being finished selected from the group consisting of friction sensors, thermal sensors, optical sensors, acoustical sensors, and electrical sensors are preferred sensors for the workpiece being finished in this invention. Workpiece thermal sensors and workpiece friction sensors are non-limiting examples of preferred workpiece friction sensors. As used herein, a workpiece friction sensor can sense the friction between the interface of the workpiece being finished and the finishing element finishing surface during operative finishing motion.

Additional non-limiting preferred examples of workpiece sensors will now be discussed. Preferred optical workpiece sensors are discussed. Preferred non-optical workpiece sensors are also discussed. The endpoint for planarization can be effected by monitoring the ratio of the rate of insulator material removed over a particular pattern feature to the rate of insulator material removal over an area devoid of an underlying pattern. The endpoint can be detected by impinging a laser light onto the workpiece being polished and measuring the reflected light versus the expected reflected light as an measure of the planarization process. A system which includes a device for measuring the electrochemical potential of the slurry during processing which is electrically connected to the slurry, and a device for detecting the endpoint of the process, based on upon the electrochemical potential of the slurry, which is responsive to the electrochemical potential measuring device. Endpoint detection can be determined by an apparatus using an interferometer measuring device to direct at an unpatterned die on the exposed surface of the wafer to detect oxide thickness at that point. A semiconductor substrate and a block of optical quartz are simultaneously polished and an interferometer, in conjunction with a data processing system are then used to monitor the thickness and the polishing rate of the optical block to develop an endpoint detection method. A layer over a patterned semiconductor is polished and analyzed using optical methods to determine the end point. An energy supplying means for supplying prescribed energy to the semiconductor wafer are used to develop a detecting means for detecting a polishing end point tot the polishing of film by detecting a variation of the energy supplied tot the semiconductor wafer. The use of sound waves can be used during chemical mechanical polishing by measuring sound waves emanating from the chemical mechanical polishing action of the substrate against the finishing element. A control subsystem can maintain a wafer count, corresponding to how many wafers are finished and the control subsystem regulates the backside pressure applied to each wafer in accordance with a predetermined function such that the backside pressure increases monotonically as the wafer count increases. The above methods are generally known to those skilled in the art. U.S. Pat. No. 5,081,796 to Schultz, U.S. Pat. No. 5,439,551 to Meikle et al., U.S. Pat. No. 5,461,007 to Kobayashi, U.S. Pat. No. 5,413,941 to Koos et. al., U.S. Pat. No. 5,637,185 Murarka et al., U.S. Pat. No. 5,643,046 Katakabe et al., U.S. Pat. No. 5,643,060 to Sandhu et al., U.S. Pat. No. 5,653,622 to Drill et al., and U.S. Pat. No. 5,705,435 to Chen. are included by reference in their entirety and included herein for general guidance and modification by those skilled in the art.

Changes in lubrication, particularly active lubrication, at the operative finishing interface can significantly affect finishing rates and finishing performance in ways that. current workpiece sensors cannot handle as effectively as sometimes desired. For instance, current workpiece sensors are less effective for monitoring and controlling multiple real time changes in lubrication, particularly active lubrication, and changes in finishing such as finishing rates. This renders prior art workpiece sensors less effective for use with lubricating boundary layer for controlling and stopping finishing where friction is adjusted or changed in real time. Secondary friction sensor subsystems as indicated above can help to improve real time control wherein the lubrication is changed during the finishing cycle time. Preferred secondary friction sensors include optical friction sensors and non-optical friction sensors. An optical friction sensor is a preferred friction sensor. Non-limiting preferred examples of optical friction sensors is an infrared thermal sensing unit such as a infrared camera and a laser adjusted to read minute changes of movement friction sensor probe to a perturbation. A non-optical sensing friction sensor is a preferred friction sensor. Non-limiting preferred examples of non-optical friction sensors include thermistors, thermocouples, diodes, thin conducting films, and thin metallic conducting films. Electrical performance versus temperature such as conductivity, voltage, and resistance is measured. Those skilled in the thermal measurement arts are generally familiar with non-optical thermal sensors and their use. A change in friction can be detected by rotating the friction sensor in operative friction contact with the finishing element finishing surface with electric motors and measuring current changes on one or both motors. The current changes related to friction changes can then be used to produce a signal to operate the friction sensor subsystem. Secondary friction detectors can be used to sense changes in friction and tangential friction forces. A secondary friction detector comprises a probe that can sense friction at the interface between a material which is separated from the workpiece surface being finished. A preferred secondary friction detector is friction sensor probe. A friction sensor probe comprises a probe that can sense friction at the interface between a material which is separate and unconnected to the workpiece surface being finished and the finishing element finishing surface. Some illustrative secondary friction sensor motions are pulsed direction changes, pulsed pressure changes, continuous motion such as circular, elliptical, and linear. An operative secondary friction sensor motion is an operative secondary friction sensor motion between the secondary friction sensor surface and the finishing element finishing surface. An absolute motion of the secondary friction sensor is preferred. Details of secondary friction sensors and their use is found in Provisional Patent Application with PTO Serial Number 60/107,300, private serial number NDTLBD1198a filed on the Nov. 6, 1998 and having the title "In Situ Friction Detector for finishing workpieces" and in a Regular Patent Application with Ser. No. 09/436,181 and private serial number 1DTL11599 filed on the same date as this application and having the title "In Situ Friction Detector for finishing semiconductor wafers" and they are included in their entirety by reference for general guidance and modification of those skilled in the art. Where the material changes with depth during the finishing of workpiece being finished, one can monitor friction changes with the secondary friction sensor having dissimilar materials even with active lubrication and therefore readily detect the end point. As an additional example, the finishing rate can be correlated with the instantaneous lubrication at the operative finishing interface, a mathematical equation can be developed to monitor finishing rate with instantaneous lubrication information from the secondary sensor and the processor then in real time calculates finishing rates and indicates the end point to the controller.

Process Control Parameters

Preferred process control parameters include those control parameters which can be changed during processing and affect workpiece finishing. Control of the operative finishing motion is a preferred process control parameter. Examples of preferred operative finishing motions include relative velocity, pressure, and type of motion. Examples of preferred types of operative finishing motion include tangential motion, planar finishing motion, linear motion, vibrating motion, oscillating motion, and orbital motion. Finishing temperature is a preferred process control parameter. Finishing temperature can be controlled by changing the heat supplied to the platen or heat supplied to the finishing composition. Alternately, friction can also change the finishing temperature and can be controlled by changes in lubrication, applied pressure during finishing, and relative operative finishing motion velocity. Changes in lubricant can be effected by changing finishing composition(s) and/or feed rate(s). A preferred group of process control parameters consists of parameters selected from the group consisting of wafer relative velocity, platen velocity, polishing pattern, finishing temperature, force exerted on the operative finishing interface, finishing composition, finishing composition feed rate, and finishing pad conditioning Processor A processor is preferred to help evaluate the workpiece finishing sensor information. A processor can be a microprocessor, an ASIC, or some other processing means. Processor preferably has computational and digital capabilities. Non limiting examples of processing information include use of various mathematical equations, calculating specific parameters, memory look-up tables or databases for generating certain parameters such as historical performance or preferred parameters or constants, neural networks, fuzzy logic techniques for systematically computing or obtaining preferred parameter values. Input parameter(s) can include information on current wafers being polished such as uniformity, expected polish rates, preferred lubricants(s), preferred lubricant concentrations, entering film thickness and uniformity, workpiece pattern. Further preferred non-limiting processor capabilities including adding, subtracting, multiplying, dividing, use functions, look-up tables, noise subtraction techniques, comparing signals, and adjusting signals in real time from various inputs and combinations thereof.

Use of Information for Feedback and Controller

Controllers to control the finishing of workpieces are generally known in the art. Controllers generally use information at least partially derived from the processor to make changes to the process control parameters. A processor is preferably operatively connected to a sensor to gain current information about the process and the processor is also operatively connected to a controller which preferably controls the finishing control parameters. As used herein, a control subsystem is a combination of an operative sensor operatively connected to a processor which is operatively connected to a controller which in turn can change finishing control parameters. An energy change sensor is nonlimiting example of a preferred operative sensor. A friction sensor is a preferred operative sensor. A workpiece sensor is a preferred operative sensor. A secondary friction sensor is another example of a preferred operative sensor. A control subsystem having a plurality of operative sensors is preferred and a control subsystem having a plurality of friction sensors is more preferred and a control subsystem having a plurality of friction sensors and workpiece sensor is even more preferred. These control subsystems can better improve control of finishing particularly where heterogeneous lubrication and/or in situ changes to lubrication are made during the finishing cycle time.

An advantage of this invention is the additional degree of control it gives to the operator performing planarization and/or polishing. To better utilize this control, the use of feedback information to control the finishing control parameters is preferred and in situ control is more preferred. Controlling the finishing control parameters selected from the group consisting of finishing composition feed rates, finishing composition concentration, operative finishing motion, and operative finishing pressure is preferred to improve control of the finishing of the workpiece surface being finished and in situ control is more particularly preferred. Another preferred example of an finishing control parameter is to use a different finishing element for a different portion the finishing cycle time such as one finishing element for the planarizing cycle time and a different finishing element for the polishing cycle time. Workpiece film thickness, measuring apparatus, and control methods are preferred methods of control. Mathematical equations including those developed based on process results can be used. Finishing uniformity parameters selected from the group consisting of Total Thickness Variation (TTV), Focal plane deviation (FPD), Within-Wafer Non-Uniformity (WIW NU), and surface quality are preferred. Average cut rate is a preferred finishing rate control parameter. Average finishing rate is a preferred finishing rate control parameter. Controlling finishing for at least a portion of the finishing cycle time with a finishing sensor subsystem to adjust in situ at least one finishing control parameter that affect finishing results is a preferred method of control finishing. Information feedback subsystems are generally known to those skilled in the art. Illustrative non limiting examples of wafer process control methods include U.S. Pat. No. 5,483,129 to Sandhu issued in 1996, U.S. Pat. No. 5,483,568 to Yano issued in 1996, U.S. Pat. No. 5,627,123 to Mogi issued in 1997, U.S. Pat. No. 5,653,622 to Drill issued in 1997, U.S. Pat. No. 5,657,123 to Mogi issued in 1997, U.S. Pat. No. 5,667,629 to Pan issued in 1997, and U.S. Pat. No. 5,695,601 to Kodera issued in 1997 are included herein for guidance and modification by those skilled in the art and are included herein by reference in their entirety.

Controlling at least one of the finishing control parameters based on using secondary friction sensor information combined with workpiece sensor information is preferred and controlling at least two of the finishing control parameters using a secondary friction sensor information combined with workpiece sensor information is more preferred. Using an electronic finishing sensor subsystem to control the finishing control parameters is preferred. Feedback information selected from the group consisting of finishing rate information and product quality information such as surface quality information is preferred. Non-limiting preferred examples of process rate information include polishing rate, planarizing rate, and workpiece finished per unit time. Non-limiting preferred examples of quality information include first pass first quality yields, focal plane deviation, total thickness variation, measures of non uniformity. Non-limiting examples particularly preferred for electronics parts include Total Thickness Variation (TTV), Focal plane deviation (FPD), Within-Wafer Non-Uniformity (WIW NU), and surface quality.

In situ process control systems relying on workpiece finishing sensors are generally known to those skilled in the CMP industry. Commercial CMP equipment advertised by Applied Materials and IPEC reference some of this equipment.

Finishing Element Conditioning

A finishing element can be conditioned before use or between the finishing of workpieces. Conditioning a finishing element is generally known in the CMP field and generally comprises changing the finishing element finishing surface in a way to improve the finishing of the workpiece. As an example of conditioning, a finishing element having no basic ability or inadequate ability to absorb or transport a finishing composition can be modified with an abrasive finishing element conditioner to have a new texture and/or surface topography to absorb and transport the finishing composition. As a non-limiting preferred example, an abrasive finishing element conditioner having a mechanical mechanism to create a finishing element finishing surface which more effectively transports the finishing composition is preferred. The abrasive finishing element conditioner having a mechanical mechanism to create a finishing element finishing surface which more effectively absorbs the finishing composition is also preferred. A abrasive finishing element conditioner having a mechanical mechanism comprising a plurality of abrasive points which through controlled abrasion can modify the texture or surface topography of a finishing element finishing surface to improve finishing composition absorption and/or transport is preferred. An abrasive finishing element conditioner having a mechanical mechanism comprising a plurality of abrasive points comprising a plurality of diamonds which through controlled abrasion can modify the texture and/or surface topography of a finishing element finishing surface to improve finishing composition absorption and/or transport is preferred.

Modifying a virgin finishing element finishing surface with a finishing element conditioner before use is generally preferred. Modifying a finishing element finishing surface with a finishing element conditioner a plurality of times is also preferred. Conditioning a virgin finishing element finishing surface can improve early finishing performance of the finishing element such as by exposing the lubricants. Modifying a finishing element finishing surface with a finishing element conditioner a plurality of times during it useful life in order to improve the finishing element finishing surface performance over the finishing cycle time by exposing new, unused lubricant, particularly new lubricant particles, is preferred. Conditioning a finishing surface by cleaning is preferred. Nondestruction conditioning is a preferred form of conditioning. Conditioning a finishing element finishing surface a plurality of times during it useful life can keep the finishing element finishing surface performance higher over its useful lifetime by exposing fresh lubricant particles to improve finishing performance is also preferred. Using feedback information, preferably information derived from friction sensor probes, to select when to modify the finishing element finishing surface with the finishing element conditioner is preferred. Using feedback information, preferably information derived from a friction sensor probe, to optimize the method of modifying the finishing element finishing surface with the finishing element conditioner is more preferred. Use of feedback information is discussed further herein in other sections.

Nonlimiting examples of textures and topographies useful for improving transport and absorption of the finishing composition and/or finishing element conditioners and general use are given in U.S. Pat. No. 5,216,843 to Breivogel, U.S. Pat. No. 5,209,760 to Wiand, U.S. Pat. No. 5,489,233 to Cook et. al., U.S. Pat. No. 5,664,987 to Renteln, U.S. Pat. No. 5,655,951 to Meikle et. al., U.S. Pat. No. 5,665,201 to Sahota, and U.S. Pat. No. 5,782,675 to Southwick and are included herein by reference in their entirety for general background and guidance and modification by those skilled in the art.

Cleaning Composition

After finishing the workpiece such as a electronic wafer, the workpiece must be carefully cleaned before the next manufacturing process step. A lubricant or abrasive particles remaining on the finished workpiece can cause quality problems later on and yield losses.

A lubricant which can be removed from the finished workpiece surface by supplying a water composition to the finished workpiece is preferred and a lubricant which can be removed from the finished workpiece surface by a hot water composition to the finished workpiece is also preferred. An example of a water composition for cleaning is a water solution comprising water soluble surfactants. An effective amount of lubricant which lowers the surface tension of water to help clean abrasive and other adventitious material from the workpiece surface after finishing is particularly preferred.

A lubricant which can be removed from the finished workpiece surface by supplying deionized or pure water to the finished workpiece to substantially remove all of the lubricant is preferred and a lubricant which can be removed from the finished workpiece surface by supplying hot deionized or pure water to the finished workpiece to substantially remove all of the lubricant is also preferred. A lubricant which can be removed from the finished workpiece surface by supplying a deionized or pure water to the finished workpiece to completely remove the lubricant is more preferred and a lubricant which can be removed from the finished workpiece surface by supplying hot deionized or pure water to the finished workpiece in to completely remove the lubricant is also more preferred. Supplying a cleaning composition having a surfactant which removes lubricant from the workpiece surface just polished is a preferred cleaning step. A lubricant which lowers the surface tension of the water and thus helps remove any particles from the finished workpiece surface is preferred.

By using water to remove lubricant, the cleaning steps are lower cost and generally less apt to contaminate other areas of the manufacturing steps. A water cleaning based process is generally compatible with many electronic wafer cleaning process and thus is easier to implement on a commercial scale.

Further Comments on Method of Operation

Boundary lubricants form lubricating boundary layers between two surfaces when the surfaces are in operative friction contact. Lubricating boundary layers can be controlled by changing the boundary layer control parameters. A preferred group of lubricating boundary layer control parameters consists of parameters selected from the group consisting of operative finishing motion, boundary lubricant concentration, boundary lubricant feed rate, chemistry of the boundary lubricant, and temperature. A preferred group of operative finishing motions consists of motions selected from the group consisting of continuous motion, discontinuous motion, and velocity of the motion. A preferred group of operative finishing motions consists of motions selected from the group consisting of continuous motion, intermittent motion, and velocity of the motion. Vibrating motion, linear motion, and circular motion are preferred motions for changing or controlling the lubricating boundary layer performance. Changing the pressure at the operative finishing interface can change the lubricating boundary layer performance. Changing the motion such as speed or type of motion can change the lubricating boundary layer performance. Changing the feed rate of the boundary lubricant can change the lubricating boundary performance. Changing the pressure applied in the operative finishing interface, either total pressure or regional pressure can change the lubricating boundary layer performance. Changing the temperature in the operative finishing interface, either average or regional temperatures can change the lubricating boundary layer performance. Changing the chemistry of the boundary lubricant can change the lubricating boundary performance. The above parameters comprise preferred lubricating boundary layer control parameters and can be used to effect changes in the finishing of the workpiece surface being finished. Changing a lubricating boundary layer control parameter to change the tangential force of friction at the operative finishing interface is preferred and changing a lubricating boundary layer control parameter to change the tangential force of friction at a region in the operative finishing interface is more preferred and changing a lubricating boundary layer control parameter to change the tangential force of friction in at least two regions of the operative finishing interface is even more preferred. Changing a control parameter to change the tangential force of friction at the operative finishing interface is preferred and changing a control parameter to change the tangential force of friction at a region in the operative finishing interface is more preferred and changing a control parameter to change the tangential force of friction in at least two regions of the operative finishing interface is even more preferred. Changing the lubricating boundary control parameters at least once during the finishing cycle time is preferred and changing the lubricating control parameters at least twice during the finishing cycle time is more preferred. Changing the lubricating boundary layer control parameters in situ is preferred and changing the lubricating boundary layer control parameters in situ with a subsystem controller is more preferred and changing the lubricating boundary layer control parameters in situ with a controller based on a secondary friction sensor signal is even more preferred. Changing at least one control parameter in situ is preferred and changing at least one control parameter in situ with a subsystem controller is more preferred and changing at least one control parameter in situ with a controller based on a secondary friction sensor signal is even more preferred. Controlling at least one control parameter in situ is preferred and controlling at least one control parameter in situ with a subsystem controller is more preferred and controlling at least one control parameter in situ with a controller based on a secondary friction sensor signal is even more preferred.

Changing at least one lubricating boundary layer control parameter during the finishing cycle time in order to change the lubricating boundary layer in a manner that changes the tangential force of friction in at least one region of the semiconductor wafer surface in the operative finishing interface is preferred. Changing at least one of the lubricating boundary layer control parameters which is in response to an in situ control signal is also preferred. Changing at least one lubricating boundary layer control parameter during the finishing cycle time changing the lubricating boundary layer in a manner that changes the tangential force of friction in at least two different regions of the semiconductor wafer surface in the operative finishing interface is more preferred. Changing of at least one lubricating layer control parameter in a manner that changes the lubricating boundary layers in at least two of different regions of the semiconductor wafer in response to an in situ control signal is also more preferred. Using a secondary friction sensor signals to aid in changing the lubricating boundary layer control parameters is even more preferred.

Applying higher pressure in the unwanted raised region on the semiconductor wafer surface compared to pressure applied to the region below the unwanted raised region causing the boundary layer lubrication thickness to be less on the unwanted raised region and the boundary lubrication thickness to be greater on at least portion of the semiconductor wafer surface below the raised region is a preferred method for differential finishing rates. Applying higher pressure in the unwanted raised region on the semiconductor wafer surface compared to pressure applied to the region below the unwanted raised region causing the boundary layer lubrication thickness to be less on the unwanted raised region and a higher temperature on the unwanted raised region and the boundary lubrication thickness to be greater on at least portion of the semiconductor wafer surface below the raised region and a lower temperature is more preferred method for differential finishing rates.

Supplying a lubricant to the workpiece surface being finished which changes the rate of a chemical reaction is preferred. Supplying a lubricant to the workpiece surface being finished having a property selected from the group consisting of workpiece surface coefficient of friction, workpiece finish rate change, a heterogeneous workpiece surface having differential coefficient of friction, and a heterogeneous workpiece surface having differential finishing rate change which reduces unwanted damage to the workpiece surface is particularly preferred. Supplying a lubricant to the workpiece surface being finished having a property selected from the group consisting of lubricant type, lubricant concentration, lubricant feed rate, lubricant effectiveness, and lubricant time period.

Using the method of this invention to finish a workpiece, especially a semiconductor wafer, by polishing for a period of time at a finishing rate and finishing uniformity according to a controllable set of at least one operational parameter that upon variation change the polishing rate and/or polishing uniformity and wherein the operational parameters are selected from the group consisting of the lubricant type, lubricant concentration, lubricant activity, and lubricating time period is preferred. Using the method of this invention to finish a workpiece, especially a semiconductor wafer, by finishing for a period of time wherein an electronic control subsystem connected electrically to the lubricant control mechanism to adjust in situ at least one operational parameter that affect the finishing rate and/or the finishing uniformity and wherein the operational parameters are selected from the group consisting of the lubricant type, lubricant concentration, lubricant activity, and lubricating time period change at the workpiece surface being finished is preferred. The electronic control subsystem is operatively connected electrically to the lubrication control mechanism. A preferred method to measure finishing rate is to measure the change in the amount of material removed in angstroms per unit time in minutes (.ANG./min). Guidance on the measurement and calculation for polishing rate for semiconductor part is found in U.S. Pat. No. 5,695,601 to Kodera et. al. issued in 1997 and is included herein in its entirety for illustrative guidance. Methods to measure and monitor finishing rate in angstroms per minute are generally known to those skilled in the relevant art.

An average finishing rate range is preferred, particularly for workpieces requiring very high precision finishing such as in process electronic wafers. Average cut rate is used as a preferred metric to describe preferred finishing rates. Average cut rate is metric generally known to those skilled in the art. For electronic workpieces, such as wafers, a cut rate of from 100 to 25,000 Angstroms per minute on at least a portion of the workpiece is preferred and a cut rate of from 200 to 15,000 Angstroms per minute on at least a portion of the workpiece is more preferred and a cut rate of from 500 to 10,000 Angstroms per minute on at least a portion of the workpiece is even more preferred and a cut rate of from 500 to 7,000 Angstroms per minute on at least a portion of the workpiece is even more particularly preferred and a cut rate of from 1,000 to 5,000 Angstroms per minute on at least a portion of the workpiece is most preferred. A finishing rate of at least 100 Angstroms per minute for at least one of the regions on the surface of the workpiece being finished is preferred and a finishing rate of at least 200 Angstroms per minute for at least one of the materials on the surface of the workpiece being finished is preferred and a finishing rate of at least 500 Angstroms per minute for at least one of the regions on the surface of the workpiece being finished is more preferred and a finishing rate of at least 1000 Angstroms per minute for at least one of the regions on the surface of the workpiece being finished is even more preferred where significant removal of a surface region is desired. During finishing there are often regions where the operator desires that the finishing stop when reached such when removing a conductive region (such as a metallic region) over a non conductive region (such as a silicon dioxide region). For regions where it is desirable to stop finishing (such as the silicon dioxide region example above), a finishing rate of at most 1000 Angstroms per minute for at least one of the regions on the surface of the workpiece being finished is preferred and a finishing rate of at least 500 Angstroms per minute for at least one of the materials on the surface of the workpiece being finished is preferred and a finishing rate of at least 200 Angstroms per minute for at least one of the regions on the surface of the workpiece being finished is more preferred and a finishing rate of at least 100 Angstroms per minute for at least one of the regions on the surface of the workpiece being finished is even more preferred where significant removal of a surface region is desired. The finishing rate can be controlled lubricants and with the process control parameters discussed herein.

Using finishing of this invention to remove raised surface perturbations and/or surface imperfections on the workpiece surface being finished is preferred. Using the method of this invention to finish a workpiece, especially a semiconductor wafer, at a planarizing rate and/or planarizing uniformity according to a controllable set of operational parameters that upon variation change the planarizing rate and/or planarizing uniformity and wherein the operational parameters of at least two operational parameters are selected from the group consisting of the type of lubricant, quantity of lubricant, and time period lubrication is preferred. Using the method of this invention to polish a workpiece, especially a semiconductor wafer, wherein an electronic control subsystem connected electrically to an operative lubrication feed mechanism adjusts in situ the subset of operational parameters that affect the planarizing rate and/or the planarizing uniformity and wherein the operational parameters are selected from the group consisting of the type of lubricant, quantity of lubricant, and time period lubrication is preferred. The electronic control subsystem is operatively connected electrically to the operative lubrication feed mechanism.

Applying an operative finishing motion in the operative finishing interface forming an organic lubricating layer such that a tangential friction force is created in the operative finishing interface which is dependent on lubricant properties other than lubricant viscosity is preferred. Applying an operative finishing motion in the operative finishing interface forming an organic lubricating layer such that a tangential friction force is created in the operative finishing interface which depends on lubricant properties other than lubricant viscosity is preferred. Applying an operative finishing motion in the operative finishing interface forming a differential organic lubricating layer such that a plurality of different tangential friction forces is created in different regions of the operative finishing interface and wherein the plurality of the different tangential friction forces are dependent on lubricant properties other than lubricant viscosity is more preferred. Applying the greater tangential friction force in the unwanted raised region of the semiconductor wafer surface being finished and also applying the lower tangential friction force to a region below and proximate to the unwanted raised region of the semiconductor wafer surface being finished is also more preferred. By creating this type of lubricating layer, finishing of the semiconductor wafer can be accomplished with good finishing rates and reduced unwanted surface defects. Planarization can be improved. Within die nonuniformity can be improved.

Using the method of this invention to polish or planarize a workpiece, especially a semiconductor wafer, supplying lubrication moderated by a finishing element having at least two layers is preferred. More preferably the finishing element having at least two layers has a finishing surface layer which has a higher hardness than the subsurface layer. A finishing element having at least two layers has a finishing surface layer which has a lower hardness than the subsurface layer is preferred, particularly for polishing. By having layers in the finishing element, additional control of the polishing and planarizing can be had. Harder layers reduce the tendency of the finishing element to follow the precise contours of the surface defects in a workpiece being finished and, especially planarized. Preferably the finishing element having at least two layers has a polishing surface layer which has a higher tensile strength than the subsurface layer. More preferably the finishing element having at least two layers has a polishing surface layer which has a lower tensile strength than the subsurface layer. By optimizing tensile strength of the layers of the finishing element, the amount of material in the finishing element can generally be reduced and longevity increased.

Changing the lubrication control parameters at least once during workpiece finishing is preferred and changing the lubrication control parameters at least twice during workpiece finishing is more preferred. Changing the lubrication control parameters in steps is preferred. Changing the lubrication control parameters based on feedback information is preferred and changing the lubrication control parameters in situ based on feed back information with an lubrication control subsystem is more preferred. Changing the lubrication control parameters such as concentration and time period (or some combination thereof) can improve the quality of the final finishing step. Supplying a plurality of lubricants during finishing can be preferred for some applications. Depending on the application and the particular surface at the moment being finished, the plurality of lubricants can be supplied simultaneously or sequentially. For instance, one can supply a planarizing lubricant and then later a polishing lubricant. A lubrication control parameter is a parameter which affects the lubrication of the operative finishing interface. A boundary lubrication control parameter is a parameter which affects the boundary lubrication in the operative finishing interface. A parameter selected from the group consisting of the lubricant chemistry, lubricant concentration, lubricant feed rate, operative finishing interface temperature, operative finishing interface pressure, and operative finishing interface motion is a preferred group of lubricating boundary layer control parameter. A parameter selected from the group consisting of the local lubricant chemistry, local lubricant concentration, local lubricant feed rate, local operative finishing interface temperature, local operative finishing interface pressure, and local operative finishing interface motion is a preferred group of local lubricating boundary layer control parameters. A local operative finishing interface pressure and local lubricating boundary layer is the local pressure and lubrication as illustrated and described in FIGS. 4 and 5 herein.

Supplying an organic lubricant for a portion of finishing cycle time is preferred. Supplying an organic lubricant for a secondary finishing step after a first finishing step free of lubricant can be preferred. Using two finishing steps, one with lubricant and one free of lubricant can reduce unwanted surface damage when finishing a semiconductor wafer. Using two finishing steps can also increase the finishing rate.

Providing a separate water borne lubricant and a separate slurry proximate to workpiece heterogeneous workpiece surface being finished for use between the finishing element finishing surface and the workpiece being finished is a preferred step in the method. Providing an effective amount of a lubricant between the finishing element finishing surface and the workpiece being finished for at least a portion of the finishing time in order to reduce the coefficient of friction between the finishing element finishing surface and the workpiece being finished and providing a separate finishing composition between the finishing element finishing surface and the workpiece being finished for at least a portion of the finishing time is also preferred. Thus separate and distinct feed lines and reservoirs for the finishing composition and the lubricant composition and each separate system delivers their product near or proximate to the point of use.

Summary

Illustrative nonlimiting examples of useful technology have been referenced by their patents numbers and all of these patents are included herein by reference in their entirety for further general guidance and modification by those skilled in the arts. The scope of the invention should be determined by the appended claims and their legal equivalents, rather than by the preferred embodiments and details are discussed herein.

I claim:

1. A method of finishing of a semiconductor wafer surface being finished having uniform regions and a plurality of wafer die, each wafer die having a repeating pattern of unwanted raised regions, the method comprising the steps of:
   providing a finishing element finishing surface;
   positioning the semiconductor wafer surface being finished proximate to the finishing surface;
   supplying an organic boundary lubricant to an interface between the semiconductor wafer surface being finished and the finishing element finishing surface;
   applying an operative finishing motion in the interface between the semiconductor wafer surface being finished and the finishing element finishing surface; and wherein
      applying the operative finishing motion to the operative finishing interface forms an organic lubricating boundary layer of from 1 to 6 molecules thick which interacts with and adheres to the semiconductor wafer surface for at least a portion of the finishing cycle time.

2. The method of finishing of the semiconductor wafer surface being finished having uniform regions and the plurality of wafer die, each wafer die having the repeating pattern of unwanted raised regions according to claim 1 further comprising an additional step of controlling the thickness of the organic lubricating boundary layer by changing at least one process control parameter in situ based on feed back information from a control subsystem.

3. The method of finishing of the semiconductor wafer surface being finished having uniform regions and the plurality of wafer die, each wafer die having the repeating pattern of unwanted raised regions according to claim 1 wherein applying the operative finishing motion causes the unwanted raised regions to have a temperature of at least 7 degrees centigrade higher than that of the proximate low local regions.

4. The method according to claim 1 wherein applying the operative finishing motion comprises applying at least five times higher pressure to the unwanted raised regions when compared to the applied pressure in a lower region proximate to the unwanted raised regions.

5. The method according to claim 1 wherein the organic lubricating boundary layer interacts with and adheres to the uniform region of the semiconductor wafer surface by dipole-dipole interactions.

6. The method of finishing of the semiconductor wafer surface being finished having uniform regions and the plurality of wafer die, each wafer die having the repeating pattern of unwanted raised regions according to claim 1 wherein the unwanted raised regions have a finishing rate measured in angstroms per minute of at least 4 times faster than in a proximate low local region.

7. The method of finishing of the semiconductor wafer surface being finished having uniform regions and the plurality of wafer die, each wafer die having the repeating pattern of unwanted raised regions according to claim 1 wherein applying the operative finishing motion comprises:
applying a higher pressure to the unwanted raised regions compared to the pressure applied to regions below the unwanted raised regions causing less boundary layer lubrication and a higher temperature on the unwanted raised regions and the boundary layer lubrication to be greater and the temperature to be lower on a portion of the semiconductor wafer surface below the unwanted raised regions.

8. The method of finishing of the semiconductor wafer surface being finished having uniform regions and the plurality of wafer die, each wafer die having the repeating pattern of unwanted raised regions according to claim 7 wherein applying the higher pressure comprises applying at least five times higher pressure to the unwanted raised region when compared to the applied pressure in a lower region proximate to the unwanted raised regions.

9. The method of finishing of the semiconductor wafer surface being finished having uniform regions and the plurality of wafer die, each wafer die having the repeating pattern of unwanted raised regions according to claim 7 wherein applying the operative finishing motion causes the unwanted raised regions to have a temperature of at least 7 degrees centigrade higher than that of the proximate low local regions.

10. The method of finishing of the semiconductor wafer surface being finished having uniform regions and the plurality of wafer die, each wafer die having the repeating pattern of unwanted raised regions according to claim 7 wherein the unwanted raised regions have a finishing rate measured in angstroms per minute of at least 4 times faster than in a proximate low local region.

11. The method of finishing of the semiconductor wafer surface being finished having uniform regions and the plurality of wafer die, each wafer die having the repeating pattern of unwanted raised regions according to claim 7 wherein the finishing element finishing surface comprises an organic synthetic polymer having a flexural modulus of at least 20,000 psi when measured according to ASTM 790 B at 73 degrees Fahrenheit.

12. The method according to claim 1 wherein the organic boundary lubricating layer is capable of changing from a solid film to a different physical form in a temperature range in the interface between the semiconductor wafer surface being finished and the finishing element finishing surface.

13. A method of finishing of a semiconductor wafer surface being finished having uniform regions having a plurality of unwanted raised regions, the method comprising the steps of:
   providing a finishing element finishing surface;
   positioning the semiconductor wafer surface being finished proximate to the finishing surface;
   supplying an organic boundary lubricant to an interface between the semiconductor wafer surface being finished and the finishing element finishing surface;
   applying an operative finishing motion in the interface between the semiconductor wafer surface being finished and the finishing element finishing surface; and wherein
      applying the operative finishing motion forms an organic lubricating boundary layer having a thickness of at most 4 molecules on at least a portion of the semiconductor surface being finished and:
      the operative finishing motion forms a friction in the interface between a uniform region of the semiconductor wafer surface and the finishing element finishing surface;
      the organic boundary layer physically or chemically interacts with and adheres to a uniform region of the semiconductor wafer surface;

the friction formed between the uniform region of the semiconductor wafer surface and the finishing element finishing surface is determined by properties other than viscosity.

14. The method of finishing of the semiconductor wafer surface being finished having uniform regions having the plurality of unwanted raised regions according to claim 13 wherein the finishing element comprises a mixture of a plurality of organic synthetic polymers.

15. The method of finishing of the semiconductor wafer surface being finished having uniform regions having the plurality of unwanted raised regions according to claim 13 wherein applying the operative finishing motion comprises:

applying a higher pressure to the unwanted raised regions compared to the pressure applied to regions below the unwanted raised regions causing less boundary layer lubrication and a higher temperature on the unwanted raised regions and the boundary layer lubrication to be greater and the temperature to be lower on a portion of the semiconductor wafer surface below the unwanted raised regions.

16. The method of finishing of the semiconductor wafer surface being finished having uniform regions having the plurality of unwanted raised regions according to claim 15 wherein applying the higher pressure comprises applying at least five times higher pressure to the unwanted raised region when compared to the applied pressure in a lower region proximate to the unwanted raised regions.

17. The method of finishing of the semiconductor wafer surface being finished having uniform regions having the plurality of unwanted raised regions according to claim 15 wherein the unwanted raised regions have a finishing rate measured in angstroms per minute of at least 4 times faster than in a proximate low local region.

18. The method according to claim 15 wherein applying the operative finishing motion causes the unwanted raised regions to have a temperature of at least 7 degrees centigrade higher than that of the proximate low local regions.

19. The method of finishing of the semiconductor wafer surface being finished having uniform regions having the plurality of unwanted raised regions according to claim 15 wherein applying the higher pressure comprises applying at least five times higher pressure to the unwanted raised region when compared to the applied pressure in a lower region proximate to the unwanted raised regions.

20. The method according to claim 15 wherein applying the operative finishing motion causes the unwanted raised regions to have a temperature of from 7 to 45 degrees centigrade higher than that of the proximate low local regions.

21. A method of finishing of a semiconductor wafer surface being finished comprising the steps of:

providing a finishing element finishing surface;

providing an organic lubricant to an operative finishing interface;

applying an operative finishing motion in the operative finishing interface forming an organic lubricating boundary layer of from 1 to 6 molecules thick; and controlling at least once the thickness of the organic lubricating boundary layer which changes the coefficient of friction in the operative finishing interface by changing at least one process control parameter in situ based on feed back information from a control subsystem during the finishing cycle time.

22. The method according to claim 21 further comprising an additional step of controlling the thickness of the organic lubricating boundary layer by changing at least one lubrication control parameter changes the tangential force of friction in at least two different regions in the operative finishing interface in response to an in situ control signal.

23. The method of finishing of the semiconductor wafer surface being finished according to claim 21 wherein the semiconductor wafer surface being finished has a plurality of unwanted raised regions and further comprising the additional step of applying a higher pressure to the plurality of unwanted raised regions with a finishing element having a flexural modulus of at least 20,000 psi when measured by ASTM 790 B at 73 degrees Fahrenheit as compared to the lower pressure applied to the lower regions proximate to the unwanted raised regions.

24. The method of finishing of the semiconductor wafer surface being finished according to claim 21 wherein the organic lubricating boundary layer is capable of changing from a solid film to a different physical form in the operative finishing interface temperature range.

25. The method of finishing of the semiconductor wafer surface being finished according to claim 21 wherein the control subsystem comprises a plurality of friction sensors.

26. The method of finishing of the semiconductor wafer surface being finished according to claim 21 wherein the control subsystem comprises a plurality of friction sensors and a workpiece sensor.

27. A method of finishing of a semiconductor wafer surface being finished comprising the steps of:

providing a finishing element finishing surface;

providing an organic lubricant to an operative finishing interface; and applying an operative finishing motion in an operative finishing interface forming an organic lubricating boundary layer of from 1 to 4 molecules thick and wherein the organic lubricating boundary layer interacts with and adheres to the semiconductor wafer surface being finished.

28. The method of finishing of the semiconductor wafer surface being finished according to claim 27 wherein applying the operative finishing motion comprises forming the organic lubricating boundary layer in the operative finishing interface, reducing the wear on the finishing element finishing surface during finishing.

29. The method of finishing of the semiconductor wafer surface being finished according to claim 27, further comprising an additional step of controlling the thickness of the organic lubricating boundary layer by changing at least one control parameter in a manner that changes the tangential force of friction in at least one region of the semiconductor wafer surface in response to an in situ control signal.

30. The method of finishing of the semiconductor wafer surface being finished according to claim 27, wherein the semiconductor wafer surface being finished has a cut rate of from 100 to 25,000 Angstroms per minute on at least a portion of the semiconductor wafer surface being finished.

31. The method of finishing of the semiconductor wafer surface being finished according to claim 27, further comprising an additional step of changing the organic lubricating boundary layer a plurality of times during the finishing cycle time to change the coefficient of friction between the finishing element finishing surface and the semiconductor wafer surface being finished the plurality of times during the finishing cycle time.

32. The method of finishing of the semiconductor wafer surface being finished according to claim 27, wherein providing the organic lubricant comprises providing a plurality of organic lubricants.

33. The method of finishing of the semiconductor wafer surface being finished according to claim 27 wherein the organic lubricating boundary layer is capable of changing from a solid film to a liquid film in the temperature range from 20 to 100 degrees centigrade.

34. The method of finishing of the semiconductor wafer surface being finished according to claim 27 wherein the semiconductor wafer surface being finished comprises a conductive region and the organic lubricating boundary layer interacts with and adheres to the conductive region.

35. The method of finishing of the semiconductor wafer surface being finished according to claim 27 wherein the semiconductor wafer surface being finished comprises a nonconductive region and the organic lubricating boundary layer interacts with and adheres to the nonconductive region.

36. A method of finishing of a semiconductor wafer surface being finished comprising the steps of:

providing a finishing element finishing surface;

providing an organic lubricant to an operative finishing interface; and applying an operative finishing motion in the operative finishing interface forming an organic lubricating boundary layer film that is capable of changing from a solid film to a different physical form in the operative finishing interface temperature range during a finishing cycle time and wherein the organic lubricating boundary layer interacts with and adheres to the semiconductor wafer surface being finished.

37. The method of finishing of the semiconductor wafer surface being finished according to claim 36, further comprising an additional step of changing the organic lubricating boundary layer film physical form by changing at least one lubrication control parameter in situ based on feed back information from a lubrication control subsystem having an energy change sensor.

* * * * *